(12) United States Patent  (10) Patent No.: US 8,114,300 B2
Millward                   (45) Date of Patent:   Feb. 14, 2012

(54) MULTI-LAYER METHOD FOR FORMATION OF REGISTERED ARRAYS OF CYLINDRICAL PORES IN POLYMER FILMS

(75) Inventor: Dan B. Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/106,562

(22) Filed: Apr. 21, 2008

(65) Prior Publication Data

US 2009/0263628 A1   Oct. 22, 2009

(51) Int. Cl.
  B44C 1/22    (2006.01)
  B82B 3/00    (2006.01)
  H01L 21/302  (2006.01)

(52) U.S. Cl. .......... 216/2; 216/17; 216/39; 216/41; 216/49; 216/83; 216/55; 216/67; 216/99; 427/98.5; 427/256; 438/700; 438/947; 977/888; 977/895; 977/900

(58) Field of Classification Search .......... None
See application file for complete search history.

(56) References Cited

U.S. PATENT DOCUMENTS

| | | | |
|---|---|---|---|
| 4,623,674 A | 11/1986 | Bailey, Jr. | |
| 4,877,647 A | 10/1989 | Klabunde | |
| 5,482,656 A | 1/1996 | Hiraoka et al. | |
| 5,538,655 A | 7/1996 | Fauteux et al. | |
| 5,622,668 A | 4/1997 | Thomas | |
| 5,904,824 A | 5/1999 | Oh | |
| 5,948,470 A | 9/1999 | Harrison et al. | |
| 6,111,323 A | 8/2000 | Carter et al. | |
| 6,143,647 A | 11/2000 | Pan et al. | |
| 6,368,871 B1 | 4/2002 | Christel et al. | |
| 6,403,382 B1 | 6/2002 | Zhu et al. | |
| 6,423,465 B1 | 7/2002 | Hawker et al. | |
| 6,503,841 B1 | 1/2003 | Criscuolo | |
| 6,506,660 B2 * | 1/2003 | Holmes et al. | 438/398 |
| 6,548,830 B1 | 4/2003 | Noguchi et al. | |
| 6,565,763 B1 | 5/2003 | Asakawa | |
| 6,566,248 B1 | 5/2003 | Wang et al. | |
| 6,569,528 B2 | 5/2003 | Nam et al. | |
| 6,689,473 B2 | 2/2004 | Guire et al. | |
| 6,699,797 B1 | 3/2004 | Morris et al. | |
| 6,713,238 B1 | 3/2004 | Chou et al. | |
| 6,746,825 B2 | 6/2004 | Nealey et al. | |
| 6,781,166 B2 | 8/2004 | Lieber et al. | |
| 6,890,624 B1 | 5/2005 | Kambe et al. | |
| 6,890,703 B2 | 5/2005 | Hawker et al. | |

(Continued)

FOREIGN PATENT DOCUMENTS

CN    1562730    1/2005

(Continued)

OTHER PUBLICATIONS

Cheng, Joy Y., et al., Nano Letters, vol. 6, No. 9, 2006, pp. 2099-2103, publ on Web Aug. 16, 2006.

(Continued)

*Primary Examiner* — Anita K Alanko
(74) *Attorney, Agent, or Firm* — Whyte Hirschboeck Dudek SC

(57) ABSTRACT

Methods for fabricating sublithographic, nanoscale polymeric microstructures utilizing self-assembling block copolymers, and films and devices formed from these methods are provided.

35 Claims, 18 Drawing Sheets

U.S. PATENT DOCUMENTS

| | | |
|---|---|---|
| 6,913,697 B2 | 7/2005 | Lopez et al. |
| 6,924,341 B2 | 8/2005 | Mays |
| 6,926,953 B2 | 8/2005 | Nealey et al. |
| 6,949,456 B2 | 9/2005 | Kumar |
| 6,962,823 B2 | 11/2005 | Empedocles et al. |
| 6,989,426 B2 | 1/2006 | Hu et al. |
| 6,992,115 B2 | 1/2006 | Hawker et al. |
| 7,030,495 B2 | 4/2006 | Colburn et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,115,995 B2 | 10/2006 | Wong |
| 7,118,784 B1 | 10/2006 | Xie |
| 7,132,370 B2 | 11/2006 | Paraschiv |
| 7,135,144 B2 | 11/2006 | Christel et al. |
| 7,135,388 B2 | 11/2006 | Ryu et al. |
| 7,135,523 B2 | 11/2006 | Ho et al. |
| 7,163,712 B2 | 1/2007 | Chilkoti et al. |
| 7,172,953 B2 | 2/2007 | Lieber et al. |
| 7,186,613 B2 | 3/2007 | Kirner |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,202,308 B2 | 4/2007 | Boussand et al. |
| 7,291,284 B2 | 11/2007 | Mirkin et al. |
| 7,347,953 B2 | 3/2008 | Black et al. |
| 7,407,887 B2 | 8/2008 | Guo |
| 7,408,186 B2 | 8/2008 | Merkulov et al. |
| 7,514,339 B2 * | 4/2009 | Yang et al. ............. 438/424 |
| 7,521,090 B1 | 4/2009 | Cheng et al. |
| 7,553,760 B2 | 6/2009 | Yang et al. |
| 7,592,247 B2 * | 9/2009 | Yang et al. ............. 438/618 |
| 7,605,081 B2 * | 10/2009 | Yang et al. ............. 438/672 |
| 7,767,099 B2 * | 8/2010 | Li et al. .................. 216/2 |
| 2003/0077452 A1 | 4/2003 | Guire et al. |
| 2003/0091752 A1 | 5/2003 | Nealey et al. |
| 2003/0100822 A1 | 5/2003 | Lew et al. |
| 2003/0143375 A1 | 7/2003 | Noguchi et al. |
| 2003/0185741 A1 | 10/2003 | Matyjaszewski |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn |
| 2004/0142578 A1 | 7/2004 | Wiesner et al. |
| 2004/0192013 A1 | 9/2004 | Ryu et al. |
| 2004/0222415 A1 | 11/2004 | Cho |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0062165 A1 | 3/2005 | Saenger et al. |
| 2005/0074706 A1 | 4/2005 | Bristol |
| 2005/0100830 A1 | 5/2005 | Xu et al. |
| 2005/0124135 A1 | 6/2005 | Ayazi et al. |
| 2005/0147841 A1 | 7/2005 | Tavkhelidze et al. |
| 2005/0167651 A1 | 8/2005 | Merkulov et al. |
| 2005/0208752 A1 | 9/2005 | Colburn et al. |
| 2005/0238889 A1 | 10/2005 | Iwamoto |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0038182 A1 | 2/2006 | Rogers et al. |
| 2006/0046079 A1 | 3/2006 | Lee |
| 2006/0046480 A1 | 3/2006 | Guo |
| 2006/0060863 A1 | 3/2006 | Lu et al. |
| 2006/0062867 A1 | 3/2006 | Choi |
| 2006/0078681 A1 | 4/2006 | Hieda et al. |
| 2006/0105562 A1 | 5/2006 | Yi |
| 2006/0124467 A1 | 6/2006 | Ho et al. |
| 2006/0134556 A1 | 6/2006 | Nealey et al. |
| 2006/0163646 A1 | 7/2006 | Black |
| 2006/0192283 A1 | 8/2006 | Benson |
| 2006/0205875 A1 | 9/2006 | Cha et al. |
| 2006/0217285 A1 | 9/2006 | Destarac |
| 2006/0231525 A1 | 10/2006 | Asakawa et al. |
| 2006/0249784 A1 | 11/2006 | Black et al. |
| 2006/0249796 A1 | 11/2006 | Tavkhelidze et al. |
| 2006/0258159 A1 | 11/2006 | Coburn et al. |
| 2006/0278158 A1 | 12/2006 | Tolbert et al. |
| 2006/0281266 A1 | 12/2006 | Wells |
| 2007/0020749 A1 | 1/2007 | Nealey et al. |
| 2007/0023805 A1 | 2/2007 | Wells |
| 2007/0045562 A1 | 3/2007 | Parekh |
| 2007/0071881 A1 | 3/2007 | Chua et al. |
| 2007/0072403 A1 | 3/2007 | Sakata |
| 2007/0122932 A1 | 5/2007 | Kodas et al. |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0227383 A1 | 10/2007 | Decre et al. |
| 2007/0249117 A1 | 10/2007 | Kang et al. |
| 2007/0281220 A1 * | 12/2007 | Sandhu et al. ............ 430/5 |
| 2007/0293041 A1 * | 12/2007 | Yang et al. ............. 438/637 |
| 2008/0032238 A1 | 2/2008 | Lu et al. |
| 2008/0083991 A1 | 4/2008 | Yang et al. |
| 2008/0093743 A1 | 4/2008 | Yang et al. |
| 2008/0103256 A1 | 5/2008 | Kim et al. |
| 2008/0164558 A1 | 7/2008 | Yang et al. |
| 2008/0176767 A1 | 7/2008 | Millward |
| 2008/0193658 A1 | 8/2008 | Millward |
| 2008/0217292 A1 | 9/2008 | Millward et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 * | 11/2008 | Millward .................... 430/5 |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0200646 A1 * | 8/2009 | Millward et al. ......... 257/632 |
| 2009/0206489 A1 | 8/2009 | Li et al. |
| 2009/0236309 A1 | 9/2009 | Millward et al. |
| 2009/0240001 A1 | 9/2009 | Regner |
| 2009/0263628 A1 | 10/2009 | Millward |
| 2009/0274887 A1 | 11/2009 | Millward et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward |
| 2010/0316849 A1 | 12/2010 | Millward et al. |
| 2010/0323096 A1 | 12/2010 | Sills et al. |

FOREIGN PATENT DOCUMENTS

| | | |
|---|---|---|
| EP | 0784543 | 4/2000 |
| EP | 1416303 A2 | 5/2004 |
| EP | 1593164 B1 | 6/2010 |
| JP | 11080414 | 3/1999 |
| JP | 2005008882 | 1/2005 |
| JP | 2006036923 | 2/2005 |
| JP | 2006105982 | 3/2006 |
| TW | 200419017 | 10/2004 |
| TW | 200511364 | 3/2005 |
| TW | 256110 | 6/2006 |
| WO | 90/07575 | 7/1990 |
| WO | 97/06013 | 2/1997 |
| WO | 99/47570 | 9/1999 |
| WO | 02081372 | 10/2002 |
| WO | 2005/122285 A2 | 12/2005 |
| WO | 2006/076016 | 7/2006 |
| WO | 2006/078952 | 7/2006 |
| WO | 2007/019439 A3 | 2/2007 |
| WO | 2007013889 A2 | 2/2007 |
| WO | 2007/024241 | 3/2007 |
| WO | 2007/024323 A2 | 3/2007 |
| WO | 2007/055041 | 5/2007 |

| | | |
|---|---|---|
| WO | 2008/091741 A2 | 7/2008 |
| WO | 2008/097736 A2 | 8/2008 |
| WO | 2008096335 A2 | 8/2008 |
| WO | 2008/124219 A2 | 10/2008 |
| WO | 2008118635 | 10/2008 |
| WO | 2008130847 | 10/2008 |
| WO | 2008130847 A1 | 10/2008 |
| WO | 2008145268 A1 | 12/2008 |
| WO | 2008156977 A2 | 12/2008 |
| WO | 2009099924 | 8/2009 |
| WO | 2009102551 | 8/2009 |
| WO | 2009117238 | 9/2009 |
| WO | 2009117243 | 9/2009 |
| WO | 2009134635 | 11/2009 |

OTHER PUBLICATIONS

Cheng, Joy Y., et al., Adv. Mater. 2003, vol. 15, No. 19, pp. 1599-1602, Oct. 2, 2003.
Cheng, Joy Y., et al., Applied Physics Letters, 91, 143106-143106-3 (2007), published online Oct. 1, 2007.
Niu, Sanjun, et al., Macromolecules, 36(7), 2428-2440, 2003 (web release date: Mar. 13, 2003) http://digitalcommons.uni.edu/cgi/viewcontent.cgi?article+1005&contect=chemeng_nanotechnology).
Parejo, Pilar Garcia, et al., J. Mater. Chem., 2006, 16, pp. 2165-2169.
Park, Cheolmin, et al., Polymer 44, 2003, 6725-6760.
Park, Miri, et al., Science, v. 276, No. 5317, p. 1401-1404, May 30, 1997.
Park, Sang-Min, et al., Adv. Mater., 2007, 19, pp. 607-611.
Park, Sung Chan, et al., Macromolecules 2007, vol. 40, No. 22, pp. 8119-8124, Published on Web Oct. 4, 2007.
Peters, Richard D., et al., J. Vac. Sci. Technol. B, vol. 18, No. 6, Nov./Dec. 2000, pp. 3530-3532.
Peters, Richard D., et al., Macromolecules, vol. 35, No. 5, 2002, pp. 1822-1834, Published on Web Jan. 26, 2002.
Potemkin, Igor I., et al., Macromol. Rapid Commun., 2007, 28, pp. 579-584.
Resnick, Douglas, J., et al., J. Microlith., Microfab., Microsyst., vol. 3, No. 2, Apr. 2004, pp. 316-321.
Ruiz, Ricardo, et al., Adv. Mater, 2007, 19, pp. 587-591.
Ryu, Du Yeol, et al., Macromolecules, vol. 40, No. 12, 2007, pp. 4296-4300, Published on Web May 19, 2007.
Saraf, Ravi R., et al., Applied Physics Letters, vol. 80, No. 23, Jun. 10, 2002, pp. 4425-4427.
Shahrjerdi, Davood, et al., IEEE Electron Device Letters, vol. 28, No. 9, Sep. 2007, pp. 793-796.
Sharma, Sadhana, et al., Applied Surface Science, 206 (2003), pp. 218-229.
Sivaniah, E., et al., Macromolecules 2003, 36, pp. 5894-5896, Publ on Web Jul. 15, 2003.
Sivaniah, et al., Macromolecules 2005, 38, 1837-1849, Publ on Web Feb. 2, 2005.
Solak, Harun H., Journal of Physics D: Applied Physics, 2006, pp. R171-R188, Published May 5, 2006.
Stoykovich, Mark P., et al., Science, vol. 308, Jun. 3, 2005, pp. 1442-1446.
Stoykovich, Mark P., et al., ACS Nano, vol. 1, No. 3, 2007, pp. 168-175, Published online Oct. 6, 2007.
Sundrani, Deepak, et al., Nano Lett., vol. 4, No. 2, 2004, pp. 273-276, Published on Web Dec. 25, 2003.
Sundrani, Deepak, et al., Langmuir 2004, vol. 20, No. 12, 2004, pp. 5091-5099, Published on Web Mar. 11, 2004.
Sigma-Aldrich, Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Van Poll, Maaike L., et al., Angew. Chem. Int. Ed. 2007, 46, pp. 6634-6637.
Winesett, D.A., et al., Langmuir 2003, 19, pp. 8526-8535, Publ on Web Aug. 22, 2003.
Xu, Ting et al., Polymer 42, (2001) 9091-9095.
Wu, C.Y., et al., IEEE, 2007, pp. 153-154.
Yamaguchi, Toru, et al., Journal of Photopolymer Science and Technology, vol. 19, No. 3, 2006, pp. 385-388.
Yan, Xiaohu, et al., J. Am. Chem. Soc., vol. 126, No. 32, 2004, pp. 10059-10066.
Yang, Xiao M., et al., Macromolecules 2000, vol. 33, No. 26, 2000, pp. 9575-9582, Publ on Web Dec. 26, 2000.
Yurt, Serkan, et al., Macromolecules 2006, vol. 39, No. 5, 2006, Published on Web Feb. 2, 2006.
Zhang, Mingfu, et al., Adv. Mater. 2007, 19, pp. 1571-1576, Published online May 15, 2007.
Bae, Joonwon, "Surface Modification Using Photo-Crosslinkable Random Copolymers", Abstract submitted for the Mar. 2006 meeting of The American Physical Society, submitted Nov. 30, 2005.
Bang, Joona, "The Effect of Humidity on the Ordering of Tri-block Copolymer Thin Films," Abstract submitted for the Mar. 2007 meeting of The American Physical Society, submitted Nov. 20, 2006.
Bass, Robert B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.
Bearinger, J.P., et al., Nature Materials 2, 259-264, 2003, published online Mar. 23, 2003.
Black, C.T., IEEE 2005 Custom Integrated Circuits Conference, pp. 87-91.
Black, C.T., et al., IBM J. Res. & Dev., vol. 51, No. 5, Sep. 2007, pp. 605-633.
Black, Charles T., ACSNano, vol. 1, No. 3, 2007, American Chemical Society, pp. 147-150, Published online Oct. 31, 2007.
Black, Charles T., et al., IEEE Electronon Device Letters, vol. 25, No. 9, Sep. 2004, pp. 622-624.
Botelho do Rego, A.M., et al., Surface Science, 482-485 (2001), pp. 1228-1234.
Brydson, Rik M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).
Canaria, Christi A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).
Chandekar, Amol, et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).
Cheng, Joy T., et al., Nano Letters, vol. 0, No. 0, A-E, published on Web Aug. 16, 2006.
Daoulas Kostas Ch., et al., Physical Review Letters 96, week ending Jan. 27, 2006, pp. 036104-1-036104-3.
Desai, Dr. Trejal A., et al., Business Briefing: Medical Device Manufacturing & Technology, 2002.
Edwards, Erik W., et al., Journal of Polymer Science: Part B Polymer Physics, vol. 43, 3444-3459, 2005.
Edwards, Erik W., et al., Advanced Mater, 16, No. 15, Aug. 4, 2004, pp. 1315-1319.
Fasolka, Michael J. et al., Macromolecules 2000, vol. 33, No. 15, pp. 5702-5712, published on web Jun. 29, 2000.
Gates, Byron D., et al., Annu. Rev. Mater. Res. 2004, 34:339-72, published online Mar. 26, 2004.
Ge, Zhenbin, et al., PRL 96, 186101-1-186101-4, The American Physical Society, week ending May 12, 2006.
Genua, A., et al., Nanotechnology, 18 (2007), pp. 1-7, Published Apr. 27, 2007.
Gillmor, S.D., et al., Langmuir 2000, vol. 16, No. 18, 2000, pp. 7223-7228, Published on Web Aug. 5, 2000.
Hamley, I. W., "Introduction to Block Copolymers", Developments in Block Copolymers Science and Technology, 2004, John Wiley & Sons, Ltd., pp. 1-29.
Hermans, Thomas M., et al., "Application of Solvent-Directed Assembly of Block Copolymers to the Synthesis of Nanostructured Materials with Low Dielectric Constants", Angewandte Chem. Int. Ed. 2006, 45, pp. 6648-6652.

Hutchison, J. Brian, et al., Chem. Mater., vol. 17, No. 19, 2005, pp. 4789-4797, published on Web Aug. 25, 2005.
In, Insik, et al., Langmuir, vol. 22, No. 18, 2006, pp. 7855-7860, published on Web Aug. 1, 2006.
Kim, Sang Ouk, et al., Nature, vol. 424, Jul. 24, 2003, pp. 411-414.
Kim, Sang Ouk, et al., Adv. Mater., 2007, 19, pp. 3271-3275.
Kim, Seung Hyun, et al., Macromolecules 2006, vol. 39, No. 24, 2006, pp. 8473-8479, published on Web Oct. 25, 2006.
Kim, Seung Hyun, et al., Advanced Mater., vol. 16, No. 23-24, pp. 2119-2123, Dec. 17, 2004.
Krishnamoorthy, Sivashankar, et al., MaterialsToday, vol. 9, No. 9, Sep. 2006, pp. 40-47.
La, Young-Hye, et al., Chem. Mater, 2007, vol. 19, No. 18, pp. 4538-4544, published on Web Jul. 28, 2007.
Laracuente, A.R., et al., Surface Science 545, 2003, pp. 70-84.
Lentz, David, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf, Feb. 2007, pp. 1-10.
Li, Mingqi, et al., MaterialsToday, vol. 9, No. 9, Sep. 2006, pp. 30-39.
Li, Xue, et al., Polymer 48 (2007), pp. 2434-2443, Available online Feb. 25, 2007.
Lin, Zhiqun, et al., Adv. Mater. 2002, 14 No. 19, Oct. 2, pp. 1373-1376.
Lin-Gibson, Sheng, et al., Macromolecules 2005, 38, pp. 2897-2902, Published on Web Mar. 8, 2005.
Malkoch, Michael, et al., Chem. Commun., 2006, pp. 2774-2776, Publ on Web Jun. 1, 2006.
Mansky, P., et al., Science, vol. 275, Mar. 7, 1997, pp. 1458-1460.
Maye, Mathew A., et al., Journal of Chemical Education, vol. 79, No. 2, Feb. 2002, pp. 207-210.
Metters, Andrew, et al., Biomacromolecules 2005, 6, pp. 290-301, 2005, Published on Web Nov. 13, 2004.
Meyer, Evelyn, et al., Macromollecular Mater. Eng., 276/277, 2000, pp. 44-50.
Mezzenga, Raffaele, et al., Langmuir 2003, vol. 19, No. 20, 2003, pp. 8144-8147, Published on Web Aug. 29, 2003.
Mindel, Joseph., et.al., "A Study of Bredig Platinum Sols", The Chemical Laboratories of New York University, vol. 65 pp. 2112.
Naito, et al., IEEE Transactions on Magnetics, vol. 38, No. 5, Sep. 2002, pp. 1949-1951.
Nealey, Paul F., et al., "Self-Assembling Resists for Nanolithography", IEEE 2005.
Nguyen, Kytai, et al., Biomaterials 23, 2002, pp. 4307-4314.
Berry, B.C., et al., "Effects of Zone Annealing on Thin Films of Block Copolymers", National Institute of Standard and Technology, Polymers Division, Gaithersburg, MD., 2007.
Black, C.T., Applied Physics Letters 87, 163116-1 to 1163116-3, 2005, published online Oct. 13, 2005.
Black, Charles T., IEEE Transactions on Nanotechnology, vol. 3, No. 3, Sep. 2004, pp. 412-415.
Cavicchi, Kevin A., et al., Macromolecules 2007, vol. 40, 2007, pp. 1181-1186, published on the web Jan. 24, 2007.
Gudipati, Chakravarthy S., et al., Journal of Polymer Science Part A: Polymer Chemistry, vol. 42, pp. 6193-6208.
Guo, Kai, et al., Abstract of "Synthesis and Characterization of Novel Biodegradable Unsaturated Poly(ester amide)/Poly(ethylene glycol) Diacrylate Hydrogels", Journal of Polymer Science Part A: Polymer Chemistry, vol. 43, Issue 17, pp. 3932-3944, 2005 Wiley Periodicals, Inc.
Karim, Alamgir et al., "Control of Ordering Kinetics and Morphology Using Zone Annealing of Thin Block Copolymer Filmes", Abstract submitted for the Mar. 2007 Meeting of The American Physical Society, Nov. 20, 2006.
Kim, Seung Hyun, et al., Adv. Mater. 2004, 16, No. 3, Feb. 3, pp. 226-231.
Park, Dae-Ho, Nanotechnology 18, 2007, 355304, pp. 1-7, Aug. 8, 2007.
Peng, Juan et al., Macromol. Rapid Commun. 2007, 28, 1422-1428.
Rogers, John A., ACS Nano, vol. 1, No. 3, pp. 151-153, 2007.
Rozkiewicz, Dorota I., et al., Angew. Chem. Int. Ed., 2006, 45, pp. 5292-5296.
Ruiz, Ricardo et al., Science, vol. 321, Aug. 15, 2008, pp. 936-939.
Segalman, Rachel A., Materials Science and Engineering R 48 (2005), pp. 191-226.
Srinvivasan, Charan, et al., ACS Nano, vol. 1, No. 3, pp. 191-201, 2007, published online Oct. 17, 2007.
Xiao, Shuaigang et al., Nanotechnology 16 (2005) S324-S329, Apr. 15, 2005.
Jun, et al., Langmuir, 2002, 18(9), pp. 3415-3417, Abstract only, Web publication date Apr. 3, 2002.
Balsara et al, CPIMA, IRG Technical Programs, Synthesis and application of Nanostructured Materials, Leland Stanford Junior Univ., 2006, http://www.stanford.eduigroup/cpima/irg/irg_1.htm, printed Jul. 1, 2009.
Bulpitt, Paul et al, Journal of Biomedical Materials Research, vol. 47, Issue 2, pp. 152-169 Abstract only, published online Aug. 13, 1999.
Elisseeff J., et al., Journal of Biomedical Materials Research, 51(2): 164-171, Aug. 2000, Abstract only.
Gelest Inc., Silane Coupling Agents: Connecting Across Boundaries, pp. 1-56, 2006.
Ji, Shengxiang, et al., Preparation of Neutral Wetting Brushes for Block Copolymer Films from Homopolymer Blends, submitted to Advanced Materials, 20(16): 3054-3060; published online Jul. 7, 2008.
Ji, Shengxiang, et al., Macromolecules, 2008, 41(23): 9098-9103.
Kim, SH, J Biomater Appl., Jul. 2000; 15(1): 23-46 Abstract only.
Kim, SH, J Biomater Res., Mar. 15, 2000; 49(4): 517-27 Abstract only.
Kim, IS, et al., Int J Pharm., Sep. 15, 2000; 205(1-2): 109-16, Abstract only.
Li, Wai-kin, et al, J. Vac. Sci. Technol. B 25(6), Nov./Dec. 2007, pp. 1982-1984, published Dec. 6, 2007.
Lutolf, M.P., et al, Nature Biotechnology, 23, 47-55 (2005), Abstract only, published online Jan. 6, 2005.
Martens, P., et al., Polymer, vol. 41, Issue 21, Oct. 2000, pp. 7715-7722, Abstract only.
Matsuda, T., et al., Asaio J, Jul.-Sep. 1992; 38(3): M154-7, Abstract only.
Sawhney, Amarpreet S., et al., Macromolecules 1993, 26, 581-587, Abstract only.
Wathier, Michel, et al., J. Am. Chem. Soc., 2004, 126 (40), pp. 12744-12745, Abstract only, web publication date Sep. 21, 2004.
Wang, C., et al., Electrochimica Acta 52 (2006), pp. 704-709, Available online Jul. 12, 2006.
Black, C.T., Proc. of SPIE, vol. 6153, 615302 (2006).
Darling, S.B., Progress in Polymer Science, vol. 32, No. 10, Sep. 28, 2007, pp. 1152-1204.
Harrison, Christopher et al., Polymer, vol. 39, No. 13, pp. 2733-2744, 1998.
Kim, Su-Jin, et al., J. Vac. Sci. Technol. B26(1), Jan./Feb. 2008, 189-194.
La, Young-Hye, et al., J. Vac. Sci. Technol. B 25(6), Nov./Dec. 2007, pp. 2508-2513.
Olayo-Valles, Roberto et al., J. Mater. Chem, 2004, 14, 2729-2731, Published on web Aug. 18, 2004.
Yang, XiaoMin, et al., J. Vac. Sci. Technol. B 22(6), Nov./Dec. 2004, 3331-3334.
Arshady et al., Makromol. Chem., 1976, vol. 177, p. 2911-2918.
Bae, J. et al Abstract submitted for the Mar. '06 meeting of the American Physical Society, submitted Nov. 2005 [online], accessed via the Internet [retrieved on Apr. 5, 2010], URL: <http://absimage.aps.org/image/MWS_MAR06-2005-003641.pdf>.
Candau et al., Polymer, 1977, vol. 18, p. 1253-1257, Dec. 1977.
Hawker et al., Facile Synthesis of Block Copolymers for Nanolithographic Applications; Polymer Reprints, 2005.
Nishikubo, T., American Chemical Society Symposium Series, 1997, p. 214-230.
He, Yiyong et al., J. Am. Chem. Soc. 2006, 128, pp. 2745-2750.
Ali, H.A., et al., Solid-State Electronics, 46 (2002) 1639-1642.
Berry et al., Orientational Order in Block Copolymer Films Zone Annealed below the Order-Disorder Transition Temperature , Nano Letters vol. 7, No. 9 Aug. 2007, p. 2789-2794.

Fukunaga et al., Self-Assembly of Block Copolymer Thin Films Having a Half-Domain-Spacing Thickness: Nonequilibrium Pathways to Achieve Equilibrium Brush Layers Parallel to Substrate, Macromolecules vol. 39, Aug. 2006, p. 6171-6179.

Hammond et al., Temperature Dependence of Order, Disorder, and Defects in Laterally Confined Diblock Copolymer Cylinder Monolayers, Macromoleculars vol. 38, Jul. 2005; p. 6575-6585.

Knoll et al., Phase Behavior in Thin Films of Cylinder-Forming Block Copolymers, Physical Review Letters vol. 89, No. 3 Jul. 2002.

Zehner, Robert W. et al., Langmuir, vol. 14, No. 2, pp. 241-244, Jan. 20, 1998..

\* cited by examiner

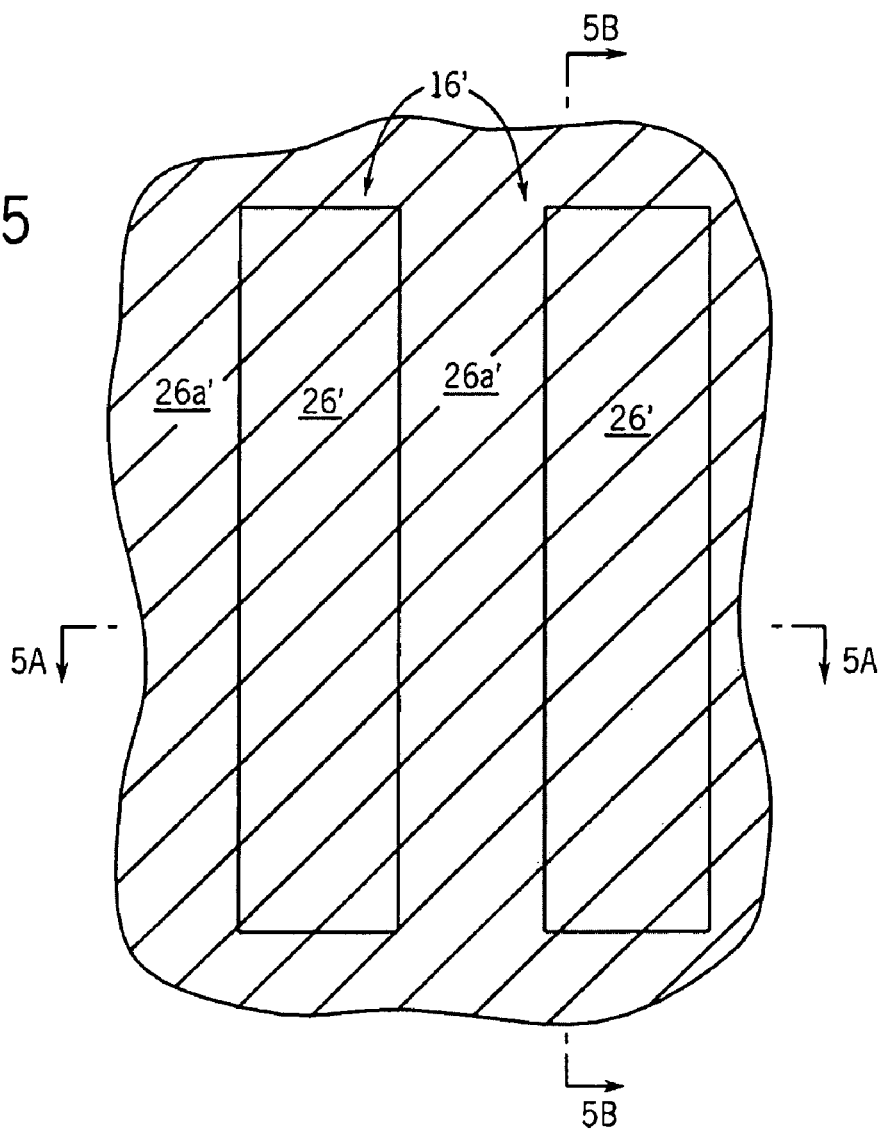
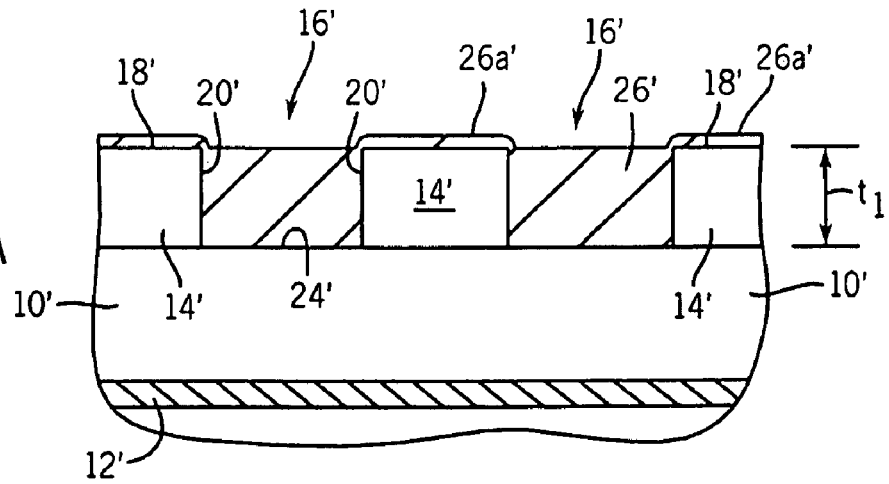

MULTI-LAYER METHOD FOR FORMATION OF REGISTERED ARRAYS OF CYLINDRICAL PORES IN POLYMER FILMS

TECHNICAL FIELD

Embodiments of the invention relate to methods of fabricating thin films of self-assembling block copolymers, and devices resulting from those methods.

BACKGROUND OF THE INVENTION

As the development of nanoscale mechanical, electrical, chemical and biological devices and systems increases, new processes and materials are needed to fabricate nanoscale devices and components. Making electrical contacts to conductive lines has become a significant challenge as the dimensions of semiconductor features shrink to sizes that are not easily accessible by conventional lithography. Optical lithographic processing methods have difficulty fabricating structures and features at the sub-30 nanometer level. The use of self assembling diblock copolymers presents another route to patterning at nanoscale dimensions. Diblock copolymer films spontaneously assemble into periodic structures by microphase separation of the constituent polymer blocks after annealing, for example by thermal annealing above the glass transition temperature of the polymer or by solvent annealing, forming ordered domains at nanometer-scale dimensions.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into a periodic spherical domains with spheres of polymer B surrounded by a matrix of polymer A. For ratios of the two blocks between about 60:40 and 80:20, the diblock copolymer assembles into a periodic hexagonal close-packed or honeycomb array of cylinders of polymer B within a matrix of polymer A. For ratios between about 50:50 and 60:40, lamellar domains or alternating stripes of the blocks are formed. Domain size typically ranges from 5-50 nm.

In some applications, the self-assembled films are further processed to selectively remove one of the blocks, leaving the other polymer block as an etch mask on the substrate. However, in some applications, the polymer block that is removed does not extend completely through the film and requires an additional etch of material to expose the underlying substrate, resulting in a reduction in the aspect ratio of the mask openings and the subsequently etched line or other opening in the substrate.

It would be useful to provide methods of fabricating films of ordered nanostructures that can be readily used to in semiconductor manufacturing.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 5-8 are top plan views of the substrate of FIG. 4 at subsequent stages in the fabrication of a self-assembled block copolymer film according to an embodiment of the disclosure. FIGS. 5A-8A illustrate elevational, cross-sectional views of a portion of the substrate depicted in FIGS. 5-8 taken along lines 5A-5A to 8A-8A, respectively. FIGS. 5B-8B are cross-sectional views of the substrate depicted in FIGS. 5-8 taken along lines 5B-5B to 8B-8B, respectively.

FIGS. 9A-10A illustrate elevational, cross-sectional views of a portion of the substrate depicted in FIGS. 9-10 taken along lines 9A-9A and 10A-10A, respectively. FIGS. 9B-10B are cross-sectional views of the substrate depicted in FIGS. 9-10 taken along lines 9B-9B to 10B-10B, respectively.

DETAILED DESCRIPTION OF THE INVENTION

The following description with reference to the drawings provides illustrative examples of devices and methods according to embodiments of the invention. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$" as used herein is the inherent periodicity or pitch value (bulk period or repeat unit) of structures that self assemble upon annealing from a self-assembling (SA) block copolymer. "$L_B$" as used herein is the periodicity or pitch value of a blend of a block copolymer with one or more of its constituent homopolymers. "L" is used herein to indicate the center-to-center cylinder pitch or spacing of cylinders of the block copolymer or blend, and is equivalent to "$L_o$" for a pure block copolymer and "$L_B$" for a copolymer blend.

Figure 1:
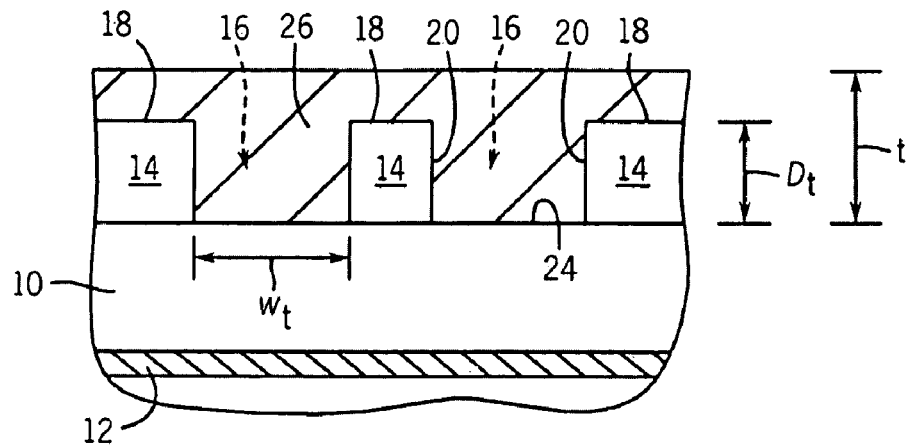
FIG. 1 illustrates an elevational, cross-sectional view of the substrate showing a block copolymer material within trenches in a substrate.
Figure 2:
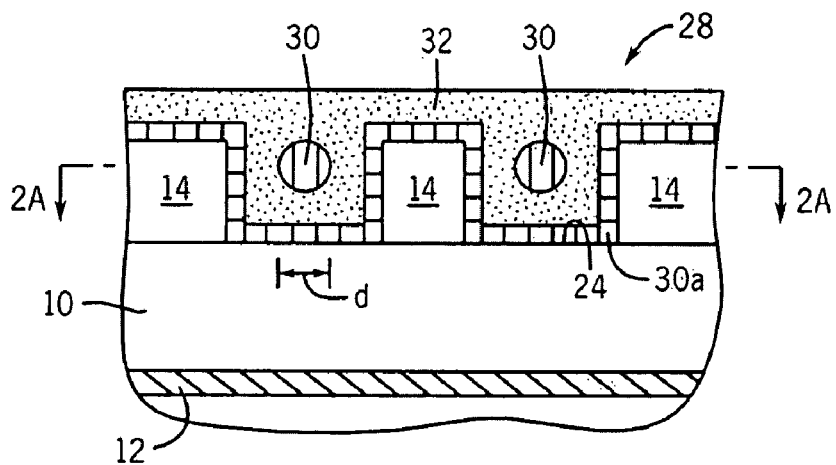
FIG. 2 illustrates a cross-sectional view of the substrate of FIG. 1 at a subsequent stage showing a self-assembled block copolymer film composed of parallel cylinders within the trenches.

FIGS. 1-2 illustrate the fabrication of a self-assembled film from a cylindrical-phase block copolymer (e.g., PS-b-P2VP) to form cylinders that are oriented parallel to the substrate surface. As shown in FIG. 1, a substrate 10 (with active areas 12) is provided with an overlying material layer 14 that has been etched to form trenches 16 separated by spacers 18. The trenches include sidewalls 20, ends 22 and a floor 24 that are preferential wetting to the minority block of the block copolymer material, e.g., oxide, etc. The width ($w_t$) of the trenches 16 is about 1.5*L and the depth ($D_t$) is about L. The thickness (t) of the block copolymer material 26 is about 0.5*L.

Figure 2A:
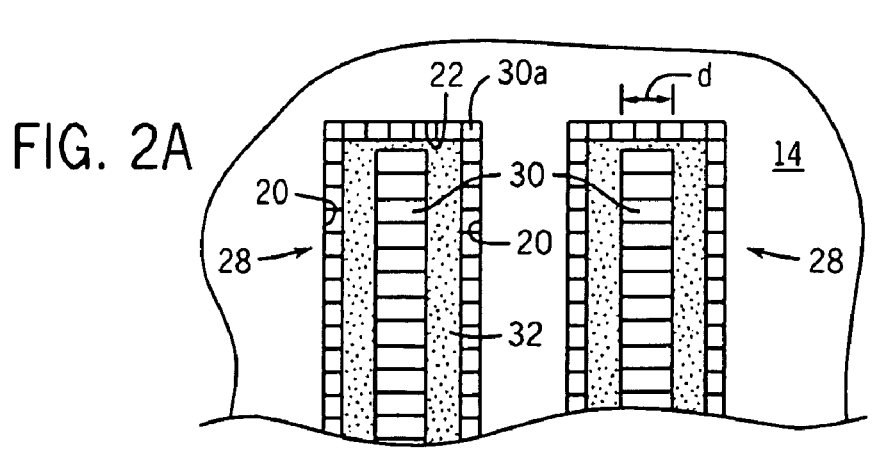
FIG. 2A is a top plan view of a portion of the substrate of FIG. 2 taken along lines 2A-2A.

As depicted in FIGS. 2-2A, annealing produces a self-assembled film 28 composed of parallel cylinders 30 (diameter (d)~0.5*L) of the minority block (e.g., P2VP) embedded within (or surrounded by) a matrix 32 of the majority block (e.g., PS) of the block copolymer material. A brush layer 30a (thickness 0.5*L) forms on the preferential wetting surfaces (e.g., oxide, etc.) of the trenches and over the surface of the material layer 14 as a bilayer composed of the minority block wetting the trench surfaces. For example, a layer of P2VP domains will wet oxide interfaces, with attached PS domains directed away from the oxide material.

The resulting film 28 with parallel cylinders 30 can be used, for example, for patterning lines, but is not useful for fabricating an etch mask for patterning vias. In addition, a thickness of the block copolymer material 26 at about 1.5*L is required at the time of annealing to produce the parallel cylinders as continuous lines.

In embodiments of the invention, a polymer material (e.g., film, layer) is prepared by guided self-assembly of block copolymers, with both polymer domains at the air interface. Block copolymer materials spontaneously assemble into periodic structures by microphase separation of the constituent polymer blocks after annealing, forming ordered domains at nanometer-scale dimensions. In embodiments of the invention, a cylindrical-phase block copolymer layer with ordered structures is formed as a base layer or film within a trench and used as a template to induce ordering of a subsequently deposited cylindrical-phase block copolymer resulting in a stacked double- or multi-layer structure having perpendicular-oriented cylinders in a polymer matrix. Following self assembly, the pattern of perpendicular-oriented cylinders that is formed can then be used, for example, as an etch mask for patterning nanosized features (e.g., vias) into the underlying substrate through selective removal of one block of the self-assembled block copolymer.

A method for fabricating a self-assembled block copolymer material that defines an array of nanometer-scale, perpendicular-oriented cylinders according to an embodiment of the invention is illustrated in FIGS. 3-8.

The described embodiment involves a thermal anneal of a cylindrical-phase block copolymer in combination with a graphoepitaxy technique that utilizes a lithographically defined trench as a guide with a floor, sidewalls and ends that are preferential wetting to one polymer block and function as constraints to induce self-assembly of the block copolymer of the base layer into an ordered one-dimensional (1-D) array of perpendicular-oriented cylindrical domains ("perpendicular cylinders") within a polymer matrix, and the cylindrical-phase block copolymer of the overlying layer into cylinders in a polymer matrix oriented perpendicular and registered to the underlying perpendicular cylinders. In some embodiments, multiple lines of the underlying perpendicular cylinders can be formed in each trench with the overlying perpendicular-oriented cylinders.

The term "perpendicular cylinders" used herein is understood to refer to the structure of the minority block of the base layer within the trenches, which shape can range from a half-sphere to an elongated cylinder with a rounded end, and is embedded within (surrounded by) a matrix of the majority block with a face wetting the air interface. The conditions provided in embodiments of the invention induce an orientational transition relative to the trench floor/substrate from parallel-oriented cylinders ("surface-parallel" cylinders) to perpendicular-oriented cylinders ("surface-normal" cylinders).

Figure 3:
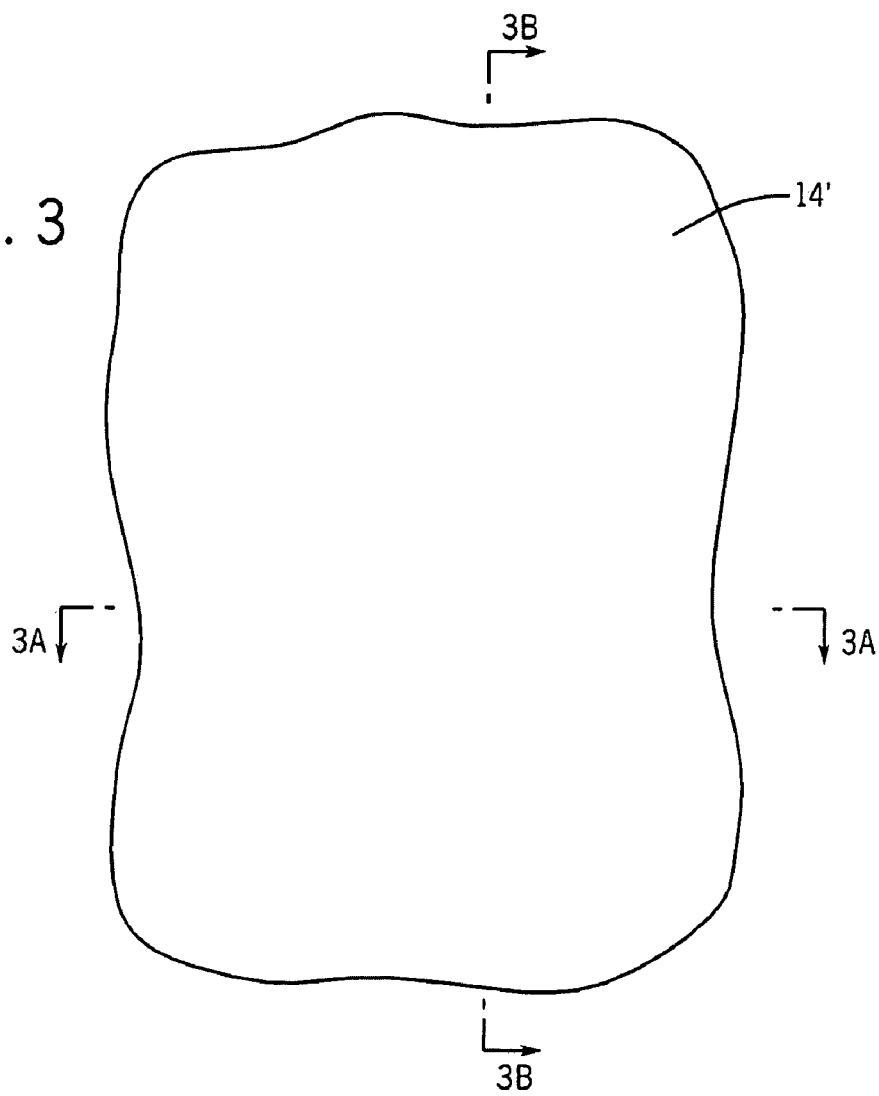
FIG. 3 illustrates a diagrammatic top plan view of a portion of a substrate at a preliminary processing stage according to an embodiment of the present disclosure.
Figure 3A:
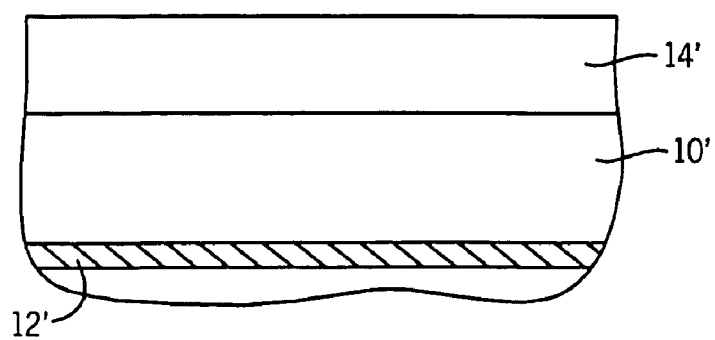
FIGS. 3A-3B are elevational, cross-sectional views of the substrate depicted in FIG. 3 taken along lines 3A-3A and 3B-3B, respectively.
Figure 3B:
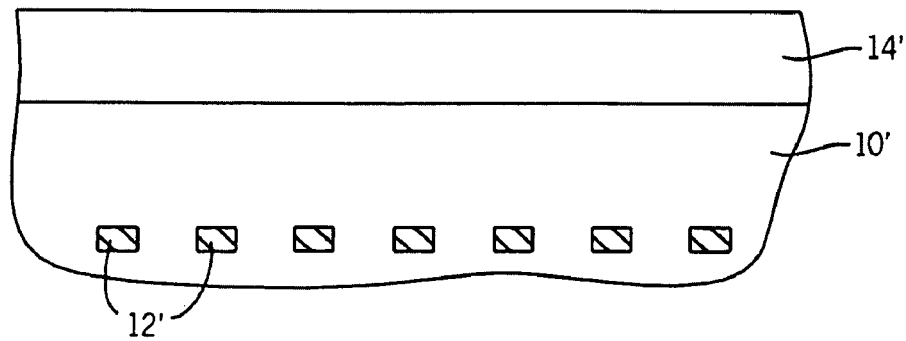

As depicted in FIGS. 3-3B, a substrate 10' is provided. As further illustrated, conductive lines 12' (or other active area, e.g., semiconducting regions) are situated within the substrate 10'.

Figure 4:
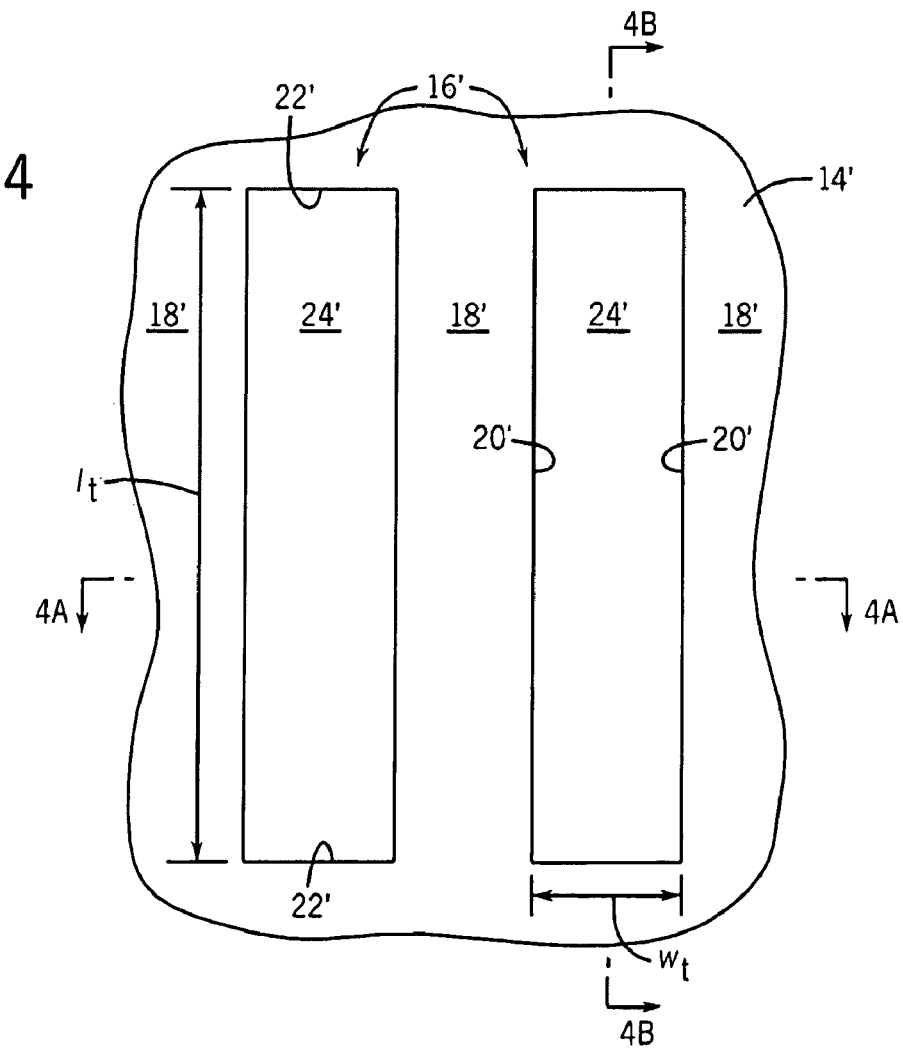
FIG. 4 illustrates a top plan view of the substrate of FIG. 3 at a subsequent stage showing the formation of trenches in a material layer formed on a substrate.
Figure 4A:
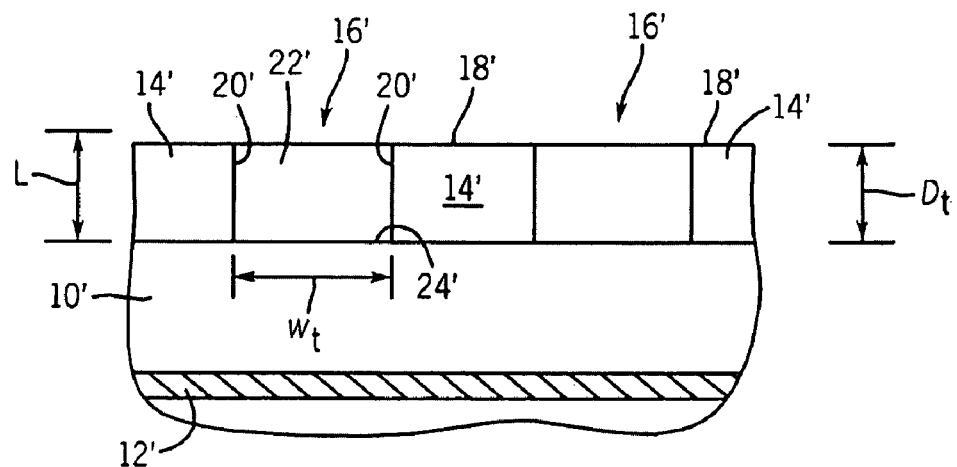
FIGS. 4A-4B illustrate elevational, cross-sectional views of a portion of the substrate depicted in FIG. 4 taken, respectively, along lines 4A-4A and 4B-4B.
Figure 4B:
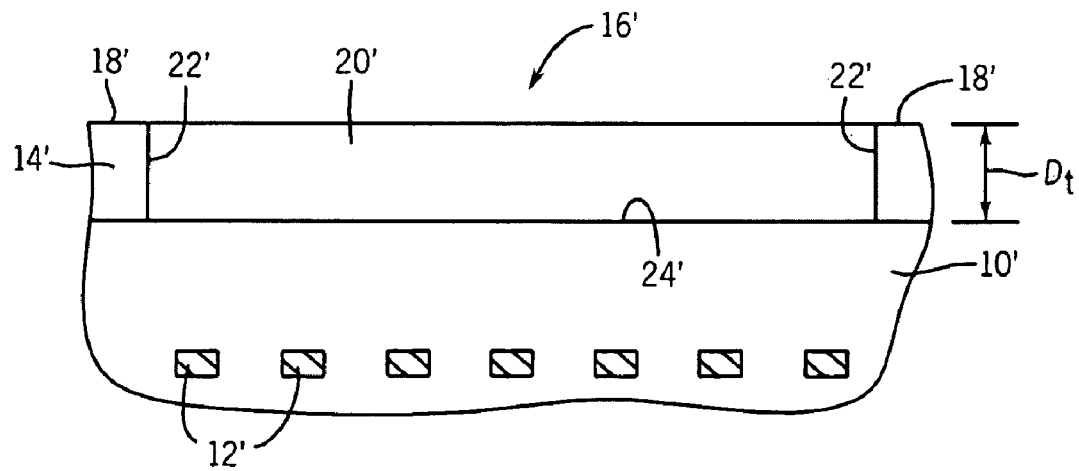

A material layer 14' (or one or more material layers) is formed over the substrate 10' and etched to form trenches 16' that are oriented perpendicular to an array of conductive lines 12', as shown in FIGS. 4-4B. Portions of the material layer 14' form a spacer 18' outside and between the trenches. The trenches 16' are structured with opposing sidewalls 20', opposing ends 22', a floor 24', a width ($w_t$), a length ($l_t$) and a depth ($D_t$).

In any of the described embodiments, a single trench or multiple trenches can be formed in the material layer 14', and can span the entire width of an array of lines (or other active area). In embodiments of the invention, the substrate 10' is provided with an array of conductive lines 12' (or other active areas) at a pitch of L. The trench or trenches are formed over the active areas 12' (e.g., lines) such that when the block copolymer material is annealed, each cylinder will be situated above a single active area 12' (e.g., conductive line). In some embodiments, multiple trenches are formed with the ends 22' of each adjacent trench 16' aligned or slightly offset from each other at less than 5% of L such that cylinders in adjacent trenches are aligned and situated above the same line 12'.

Single or multiple trenches 16' (as shown) can be formed using a lithographic tool having an exposure system capable of patterning at the scale of L (10-100 nm). Such exposure systems include, for example, extreme ultraviolet (EUV) lithography, proximity X-rays and electron beam (e-beam) lithography, as known and used in the art. Conventional photolithography can attain (at smallest) about 58 nm features.

A method called "pitch doubling" or "pitch multiplication" can also be used for extending the capabilities of photolithographic techniques beyond their minimum pitch, as described, for example, in U.S. Pat. No. 5,328,810 (Lowrey et al.), U.S. Pat. No. 7,115,525 (Abatchev, et al.), US 2006/0281266 (Wells) and US 2007/0023805 (Wells). Briefly, a pattern of lines is photolithographically formed in a photoresist material overlying a layer of an expendable material, which in turn overlies a substrate, the expendable material layer is etched to form placeholders or mandrels, the photoresist is stripped, spacers are formed on the sides of the mandrels, and the mandrels are then removed leaving behind the spacers as a mask for patterning the substrate. Thus, where the initial photolithography formed a pattern defining one feature and one space, the same width now defines two features and two spaces, with the spaces defined by the spacers. As a result, the smallest feature size possible with a photolithographic technique is effectively decreased down to about 30 nm or less.

Factors in forming a 1-D array of perpendicular cylinders within the trenches include the width ($w_t$) of the trench, the formulation of the block copolymer or blend to achieve the desired pitch (L), and the total volume or thickness ($t_2$) of the block copolymer material within the trench at the end of the anneal at less than 2*L.

The width ($w_t$) of the trench can be varied according to the desired number of rows and pattern of perpendicular cylinders. In the illustrated embodiment, the trenches 16' are constructed with a width ($w_t$) of about 1.5*L (or 1.5× the pitch value) of the block copolymer to form a single row of perpendicular cylinders. A cast block copolymer material (or blend) of about L and having a total thickness of less than 2*L at the end of anneal will self assemble within the trenches 16' into perpendicular cylinders in a single row or line that is aligned with the sidewalls down the center of each trench 16' with a center-to-center pitch distance (p) between adjacent perpendicular cylinders at or about the pitch distance or L value of the block copolymer material. For example, in using a cylindrical-phase block copolymer with an about 35 nm pitch value or L, the width ($w_t$) of the trenches 16' can be about 0.5*35 nm or about 55 nm to form a single row of perpendicular cylinders (each at about 20 nm diameter).

There is a shift from two rows to one row of the perpendicular cylinders as the width ($w_t$) of the trench is decreased and/or the periodicity (L value) of the block copolymer is increased, for example, by forming a ternary blend by the addition of both constituent homopolymers. The boundary conditions of the trench sidewalls 20' in both the x- and y-axis impose a structure wherein each trench contains "n" number of features (e.g., n lines of perpendicular cylinders).

For example, in embodiments of the invention in which a trench has a width greater than 1.5*L, for example, a width of about 2*L to about 2.5*L, a cylindrical-phase block copolymer with a pitch of L and having a total thickness of less than 2*L at the end of anneal will self-assemble to form perpendicular cylinders in a hexagonal array or a zigzag pattern with adjacent cylinders offset by about 0.5*L for the length ($l_t$) of the trench, rather than a single line row of perpendicular cylinders each separated by about L (center-to-center distance) and aligned with the sidewalls down the center of the trench. For example, a cylindrical-phase block copolymer material having a L value of about 35 nm within a trench having a width of about 2-2.5*L or about 70-87.5 nm will self assemble to form a hexagonal array of perpendicular cylinders (about 20 nm diameter) with a center-to-center pitch distance between adjacent cylinders of about 0.5*L value.

The depth ($D_t$) of the trenches 16' is effective to direct lateral ordering of the block copolymer material during the anneal. In embodiments of the invention, the depth ($D_t$) of the trenches 16' is at or less than the final thickness ($t_2$) of the block copolymer material ($D_t \leq t_2$), which minimizes the formation of a meniscus and variability in the thickness of the block copolymer material across the trench width. In some embodiments, the trench depth is about 50-90% less, or about one-half to about two-thirds (about ½-⅔, or about 50%-67%) less than the final thickness ($t_2$) of the block copolymer material within the trench.

The length ($l_t$) of the trenches 16' is according to the desired number of perpendicular cylinders in a row, and is generally at or about n*L or an integer multiple of L, and typically within a range of about n*10 to about n*100 nm (with n being the number of features or structures, e.g., perpendicular cylinders).

The width of the mesas or spacers 18' between adjacent trenches can vary and is generally about L to about n*L. In some embodiments, the trench dimension is about 20-100 nm wide ($w_t$) and about 100-25,000 μm in length ($l_t$) with a depth ($D_t$) of about 10-100 nm.

The trench sidewalls 20', ends 22' and floor 24' are preferential wetting by a minority block of the block copolymer to induce registration of cylinders (of the minority block) in a perpendicular orientation to the trench floor as the polymer blocks self-assemble to form the base layer 28'. The substrate 10' and material layer 14' can be formed from the same or a highly similar material that is inherently preferential wetting to the minority (preferred) polymer block (e.g., PMMA of a PS-b-PMMA material) or, in other embodiments, a preferential wetting material can be applied onto the surfaces of the trenches 16'.

To provide preferential wetting surfaces, for example, in the use of a PS-b-PMMA or PS-b-PVP block copolymer, the substrate 10' and the material layer 14' can be composed of an inherently preferential wetting material such as a clean silicon surface (with native oxide), oxide (e.g., silicon oxide, $SiO_x$), silicon nitride, silicon oxycarbide, indium tin oxide (ITO), silicon oxynitride, and resist materials such as methacrylate-based resists and polydimethyl glutarimide resists, among other materials, which exhibit preferential wetting toward the preferred block (e.g., the minority block) (e.g., PMMA, PVP, etc.). Upon annealing and self assembly of the block copolymer material, the preferred (minority) block (e.g., the PMMA block, PVP block, etc.) will form a thin interface layer along the preferential wetting surfaces 20', 22', 24' of the trenches.

In other embodiments utilizing PS-b-PMMA, a preferential wetting material such as a polymethylmethacrylate (PMMA) polymer modified with an —OH containing moiety (e.g., hydroxyethyl methacrylate) can be applied onto the surfaces of the trenches. An OH-modified PMMA can be applied, for example, by spin coating and then heating (e.g., to about 170° C.) to allow the terminal —OH groups to end-graft to oxide surfaces (e.g., sidewalls 20', ends 22', floor 24'). Non-grafted material can be removed by rinsing with an appropriate solvent (e.g., toluene). See, for example, Mansky et al., *Science*, 1997, 275, 1458-1460, and In et al., *Langmuir*, 2006, 22, 7855-7860.

Figure 5B:
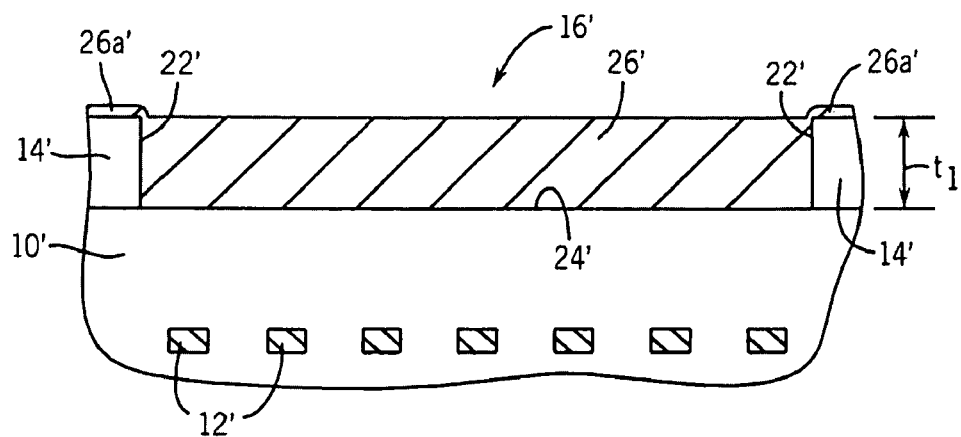

Referring now to FIGS. 5-5B, a self-assembling, cylindrical-phase block copolymer material 26' having an inherent pitch at or about $L_o$ (or a ternary blend of block copolymer and homopolymers blended to have a pitch at or about $L_B$) is deposited into the trenches 16' to form a base layer 28'.

Nonlimiting examples of diblock copolymers include, for example, poly(styrene)-b-poly(methylmethacrylate) (PS-b-PMMA) or other PS-b-poly(acrylate) or PS-b-poly(methacrylate), poly(styrene)-b-poly(vinylpyridine) (PS-b-PVP), poly(styrene)-b-poly(lactide) (PS-b-PLA), and poly(styrene)-b-poly(tert-butyl acrylate) (PS-b-PtBA), poly(styrene)-b-poly(ethylene-co-butylene (PS-b-(PS-co-PB)), poly (styrene)-b-poly(ethylene oxide) (PS-b-PEO), polybutadiene-b-poly(vinylpyridine) (PB-b-PVP), poly(ethylene-alt-propylene)-b-poly(vinylpyridine) (PEP-b-PVP), and poly(styrene)-b-poly(dimethylsiloxane) (PS-b-PDMS), among others, with PS-b-PMMA used in the illustrated embodiment. Other types of block copolymers (i.e., triblock or multiblock copolymers) can be used. Examples of triblock copolymers include ABC copolymers such as poly(styrene-b-methyl methacrylate-b-ethylene oxide) (PS-b-PMMA-b-PEO), and ABA copolymers such as PS-PMMA-PS, PMMA-PS-PMMA, and PS-b-PI-b-PS, among others.

In some embodiments of the invention, the block copolymer or blend is constructed such that the minor domain can be selectively removed.

The L value of the block copolymer can be modified, for example, by adjusting the molecular weight of the block copolymer. The block copolymer material can also be formulated as a binary or ternary blend comprising a block copolymer and one or more homopolymers (HPs) of the same type of polymers as the polymer blocks in the block copolymer, to produce a blend that will swell the size of the polymer domains and increase the L value. The concentration of homopolymers in a blend can range from 0 to about 60 wt-%. Generally, when added to a polymer material, both homopolymers are added to the blend in about the same ratio or amount. An example of a ternary diblock copolymer/homopolymer blend is a PS-b-PVP/PS/PVP blend, for example, 60 wt-% of 32.5 K/12 K PS-b-PVP, 20 wt-% of 10K PS, and 20 wt-% of 10K PVP. Another example of a ternary diblock copolymer/homopolymer blend is a PS-b-PMMA/PS/PMMA blend, for example, 60 wt-% of 46K/21K PS-b-PMMA, 20 wt-% of 20K polystyrene and 20 wt-% of 20K poly(methyl methacrylate). Yet another example is a blend of 60:20:20 (wt-%) of PS-b-PEO/PS/PEO, or a blend of about 85-90 wt-% PS-b-PEO and up to 10-15 wt-% PEO homopolymer.

The film morphology, including the domain sizes and periods (L) of the microphase-separated domains, can be controlled by chain length of a block copolymer (molecular weight, MW) and volume fraction of the AB blocks of a diblock copolymer to produce cylindrical morphologies (among others). For example, in embodiments of the invention, for volume fractions at ratios of the two blocks generally between about 60:40 and 80:20, the diblock copolymer will microphase separate and self-assemble into periodic perpendicular cylinder domains of polymer B within a matrix of polymer A. An example of a cylinder-forming PS-b-PVP copolymer material ($L_o$~28 nm) to form about 14 nm diameter perpendicular cylinder PVP domains in a matrix of PS is composed of about 70 wt-% PS and 30 wt-% PVP with a total molecular weight ($M_n$) of 44.5 kg/mol. An example of a cylinder-forming PS-b-PMMA copolymer material ($L_o$=35 nm) to form about 20 nm diameter perpendicular cylinder PMMA domains in a matrix of PS is composed of about 70 wt-% PS and 30 wt-% PMMA with a total molecular weight ($M_n$) of 67 kg/mol. As another example, a PS-b-PLA copolymer material (L=49 nm) can be composed of about 71 wt-% PS and 29 wt-% PLA with a total molecular weight ($M_n$) of about 60.5 kg/mol to form about 27 nm diameter perpendicular cylinder PLA domains in a matrix of PS.

The block copolymer material can be deposited by spin casting (spin-coating) from a dilute solution (e.g., about 0.25-2 wt % solution) of the block copolymer in an organic solvent such as dichloroethane ($CH_2Cl_2$) or toluene, for example. Capillary forces pull excess block copolymer material 26' (e.g., greater than a monolayer) into the trenches 16'. As shown in FIG. 5A, a thin layer or film 26a' of the block copolymer material can be deposited onto the material layer 14' outside the trenches, e.g., on the mesas/spacers 18'. Upon annealing, the thin film 26a' (in excess of a monolayer) will flow off the mesas/spacers 18' into the trenches leaving a structureless brush layer on the material layer 14' from a top-down perspective.

Figure 6:
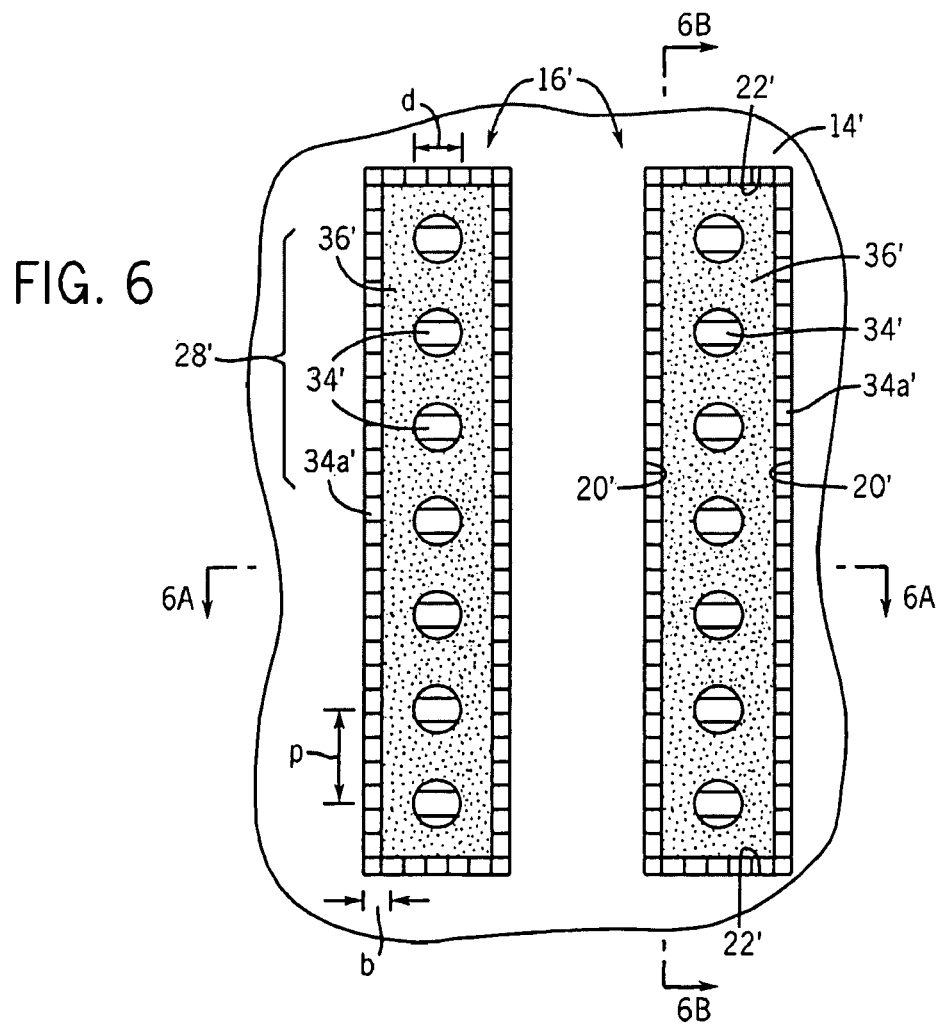
Figure 6A:
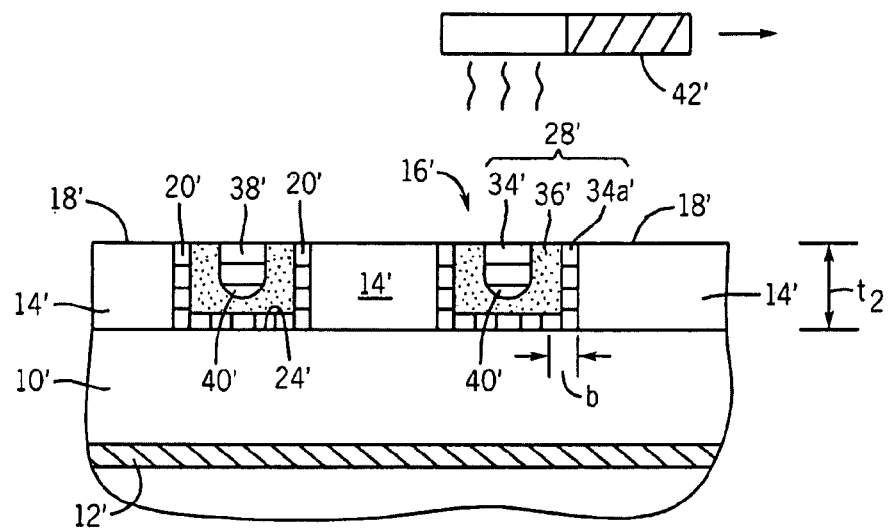
Figure 6B:
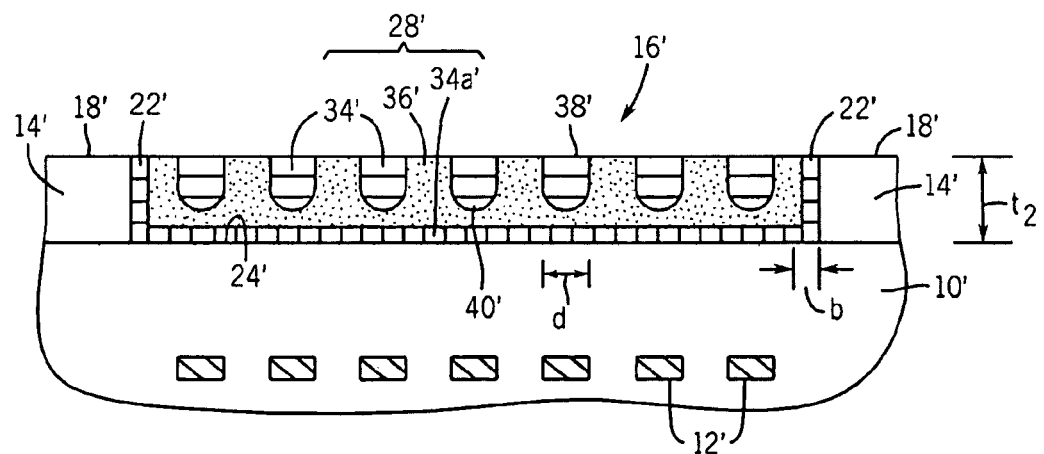

Referring now to FIGS. 6-6B, the block copolymer material 26' is then annealed to form the self-assembled base layer 28'.

Upon annealing, the cylindrical-phase block copolymer material (e.g., PS-b-PMMA) will self-assemble in response to the constraints provided by the width ($w_t$) of the trench 16' and the character of the cylindrical-phase block copolymer composition 26' (e.g., PS-b-PMMA having an inherent pitch at or about L) combined with trench surfaces 20', 22', 24' that are preferential wetting by the minority or preferred block of the block copolymer (e.g., the PMMA block), and a total thickness ($t_2$) of the BCP material 26' within the trench of less than 2*L at the end of anneal. Enthalpic forces drive the wetting of a preferential-wetting surface by the preferred block (e.g., the minority block). In some embodiments in which the width (w) of the trench is greater than 1.5*L, an ordered hexagonal array of perpendicular cylinders can be formed in each trench.

The resulting base layer 28' is composed of a monolayer of perpendicular cylinder domains 34' of the preferred (minority) block (e.g., PMMA) within a matrix 36' of the majority polymer block (e.g., PS) oriented perpendicular to the trench floor 24' and registered and aligned parallel to the trench sidewalls 20' in a row down the middle of each trench for the length of the trench and spaced apart at a center-to-center pitch distance of about L. The face 38' of the perpendicular cylinders wets the air interface (surface exposed) and the opposing ends 40' are embedded in (surrounded by) the polymer matrix 36'. The diameter (d) of the perpendicular cylinders 34' will generally be about one-half of the center-to-center distance (pitch distance, p) between the perpendicular cylinders. Upon annealing, a layer of the minority (preferred) block segregates to and wets the sidewalls 20', ends 22' and floor 24' of the trenches to form a thin brush wetting layer 34a' with a thickness of generally about 0.5*L. The brush layer 34a' is a bilayer of the minority block domains (e.g., PMMA) wetting trench (e.g., oxide) interfaces with attached majority block domains (e.g., PS) directed away from the trench surfaces and in contact with the majority block domains (e.g., PS) of the matrix 36' at the surface of the perpendicular cylinder domains 34'.

The resulting morphology of the annealed polymer material base layer 28', i.e., the perpendicular orientation of the perpendicular cylinders 34', can be examined, for example, using atomic force microscopy (AFM), transmission electron microscopy (TEM), scanning electron microscopy (SEM).

In some embodiments, the self-assembled base layer 28' is defined by an array of perpendicular cylinders 34' in a polymer matrix 36' and a brush layer 34a' (at about 0.5*L thick), each cylinder 34' having a rounded end 40' and a diameter at or about 0.5*L, with the number (n) of perpendicular cylinders in the row according to the length of the trench, and the center-to-center distance (pitch distance, p) between perpendicular cylinders at or about L.

The block copolymer material 26' is cast into the trenches 16' to an initial thickness ($t_1$) such that upon completion of inflow of polymer material off the mesas/spacers 18' into the trenches and at the end of the anneal, the total volume or thickness ($t_2$) of the block copolymer material 26' will induce and result in the formation of perpendicular cylinders 34' in the trench.

In embodiments of the invention, the block copolymer material 26' within the trenches at the end of the anneal has an insufficient volume of polymer material to fully form surface parallel cylinders (30) that would typically result under the same or similar conditions (e.g., of trench width ($w_t$), trench depth ($D_t$), block copolymer material at about L, preferentially wetting trench surfaces). The total volume or thickness ($t_2$) of the block copolymer (BCP) material 26' after the anneal is effective to induce a transition from a surface parallel to a surface normal (or perpendicular) orientation of cylindrical domains relative to the trench floor/substrate surface. The thickness of the block copolymer material 26' can be measured, for example, by ellipsometry techniques.

For example, to form the surface parallel cylinder morphology 30 as illustrated in FIGS. 1-2, in the application of a block copolymer (such as PS-b-P2VP) in which the minority block (e.g., P2VP) is strongly preferentially wetting to the trench surfaces (e.g., oxide) and the majority block is preferential wetting to the air interface (e.g., PS, which has a lower surface tension, preferentially wets a clean dry air atmosphere), a typical thickness (t) of the block copolymer material 26 at the end of the anneal to form a monolayer of parallel cylinders (and a brush layer 30a) is t=b+L (where b is the thickness of the brush layer 30a at about 0.5*L), or t=0.5*L+L=1.5*L.

According to embodiments of the invention, the thickness ($t_2$) of a block copolymer material 26' such as PS-b-P2VP at the end of the anneal should be sufficiently less than the thickness t=b+L (e.g., t<1.5*L) to result in a switch in the orientation of the cylinders from surface parallel (FIG. 2, cylinders 30) to perpendicular (or surface normal) (FIG. 6A, cylinders 34') while retaining the brush layer 34a' in contact with the trench surfaces 20', 22', 24'. In addition, the face 38' of the perpendicular cylinders 34' wets the air interface and the opposing ends 40' are rounded. In some embodiments, the total volume or thickness ($t_2$) of a PS-b-P2VP block copolymer material 26' (or similar polymer material) after inflow from the mesas/spacers 18' and at the end of anneal is about 5-30% less (or about 10-20% less) than the 1.5*L value of the block copolymer material, or $t_2$~70-95%*(1.5*L). For example, for a PS-b-P2VP block copolymer material where L=35 nm, the PS-b-P2VP block copolymer material 26' can be cast into the trenches 16' and the polymer material 26a' caused to flow into the trenches wherein the total volume or thickness ($t_2$) of the block copolymer material 26' at the end of anneal is [(about 0.70 to about 0.95)*(1.5*35 nm)], or about 36.75-49.9 nm thick.

In embodiments utilizing a block copolymer (such as PS-b-PMMA) in which the minority block (e.g., PMMA) is preferentially wetting to trench surfaces (e.g., oxide) and both the minority block and the majority block (e.g., PS) wet the air interface equally well, the typical thickness ($t_2$) of the block copolymer material 26 to form a monolayer of parallel cylinders (over a brush layer 30a) (FIGS. 1-2) is generally $t_2$~L. According to embodiments of the invention, a film 26' of a block copolymer material such as PS-b-PMMA within the trenches 16' at the end of anneal should be at less than the L value or $t_2$<L to result in a reorientation of the cylinders from parallel to perpendicular with a brush layer 34a' in contact with the trench surfaces 20', 22', 24'. In this application, the cylinders 34' have a shorter length and appear as half-spheres due to the rounded ends 40'. In some embodiments, the total volume or thickness ($t_2$) of a PS-b-PMMA block copolymer material 26' (or similar material) after inflow from the mesas/spacers 18' and at the end of anneal is about 5-30% less (or about 10-20% less) than the L value of the block copolymer material, or $t_2$~70-95%*(1*L). For example, for a PS-b-PMMA block copolymer material where L=35 nm, the PS-b-PMMA block copolymer material 26' can be cast into the trenches 16' and the polymer material 26a' caused to flow into the trenches wherein the total volume or thickness ($t_2$) of the block copolymer material 26' after the anneal is [(about 0.70 to about 0.95)*(35 nm)], or about 24.5-33.25 nm thick, resulting in surface normal (perpendicular) cylinders 34' within the trenches.

In embodiments utilizing a block copolymer material (such as PS-b-PDMS) in which the minority block (e.g., PDMS) preferentially wets both the trench surfaces and air interface, the typical thickness ($t_2$) of the block copolymer material 26 to form a monolayer of parallel cylinders (over a brush layer 30a) (FIGS. 1-2) is generally $t_2$=2*L. According to embodiments of the invention, a film 26' of a block copolymer material such as PS-b-PDMS within trenches 16' at the end of anneal should have a thickness ($t_2$) of less than about 2*L (or at $t_2$<2*L) to result in a reorientation to perpendicular cylinders 34' (FIG. 6A) in which the cylinders are perpendicular to the trench floor 24' with rounded ends 40'. In some embodiments, the total volume or thickness ($t_2$) of PS-b-PDMS block copolymer material 26' (or similar material) after anneal is about 5-30% less (or about 10-20% less) than 2*L value of the block copolymer material, or $t_2$~70-95%*(2*L). For example, for a PS-b-PDMS block copolymer material where L=35 nm, the PS-b-PDMS block copolymer material 26' can be cast into the trenches 16' and the polymer material 26a' caused to flow into the trenches wherein the total volume or thickness ($t_2$) of the block copolymer material 26' after the anneal is [(about 0.70 to about 0.95)*(2*35 nm)], or about 49-66.5 nm thick.

The polymer material 26' can be annealed to form the polymer base layer 28', for example, by thermal annealing to above the glass transition temperature of the component blocks of the copolymer material to cause the polymer blocks to separate and self assemble in response to the preferential wetting of the trench surfaces 20', 22', 24'. For example, a PS-b-PMMA copolymer film can be annealed at a temperature of about 150-275° C. in a vacuum oven for about 1-24 hours to achieve the self-assembled morphology.

The block copolymer material 26' can be globally heated or, in other embodiments, a zone or localized thermal anneal can be applied to portions or sections of the block copolymer material 26'. For example, the substrate can be moved across a temperature gradient 42' (FIG. 6A), for example, a hot-to-cold temperature gradient, positioned above (as shown) or underneath the substrate (or the thermal source can be moved relative to the substrate, e.g., arrow →) such that the block copolymer material self-assembles upon cooling after passing through the heat source. Only those portions of the block copolymer material that are heated above the glass transition temperature of the component polymer blocks will self-assemble, and areas of the material that were not sufficiently heated remain disordered and unassembled. "Pulling" the heated zone across the substrate can result in faster processing and better ordered structures relative to a global thermal anneal.

After the block copolymer material is annealed and ordered, the base layer (film) 28' can then be treated to crosslink one of the polymer domains to fix and enhance the strength of the polymer domain, for example, the polymer matrix 36' (e.g., the PS segments to make the PS matrix insoluble). The polymer block can be structured to inherently crosslink (e.g., upon UV exposure) or formulated to contain a crosslinking agent.

Generally, the block copolymer material 26a' outside the trenches will not be thick enough to result in self-assembly. Optionally, the unstructured thin film 26a' of the block copolymer material outside the trenches (e.g., on mesas/spacers 18') can be removed, as illustrated in FIGS. 6A-6B, for example, by an etch technique or a planarization process. For example, the trench regions can be selectively exposed through a reticle (not shown) to crosslink only the annealed and self-assembled polymer material 28' within the trenches 16', and a wash can then be applied with an appropriate solvent (e.g., toluene) to remove the non-crosslinked portions of the block copolymer material 26a' (e.g., on the spacers 18'), leaving the registered self-assembled base layer 28' within the trench and exposing the surface (18') of the material layer 14' above/outside the trenches. In another embodiment, the polymer material 26' can be crosslinked globally, a photoresist material can be applied to pattern and expose the areas of the polymer material 26a' outside the trench regions, and the exposed portions of the polymer material 26a' can be removed, for example by an oxygen ($O_2$) plasma treatment.

The annealed and self-assembled base film 28' is then used as a template for inducing the ordering of an overlying cylindrical-phase block copolymer material such that the cylindrical domains of the annealed second film will orient perpendicular and registered to the underlying pattern of perpendicular cylinders in the base film.

Figure 7:
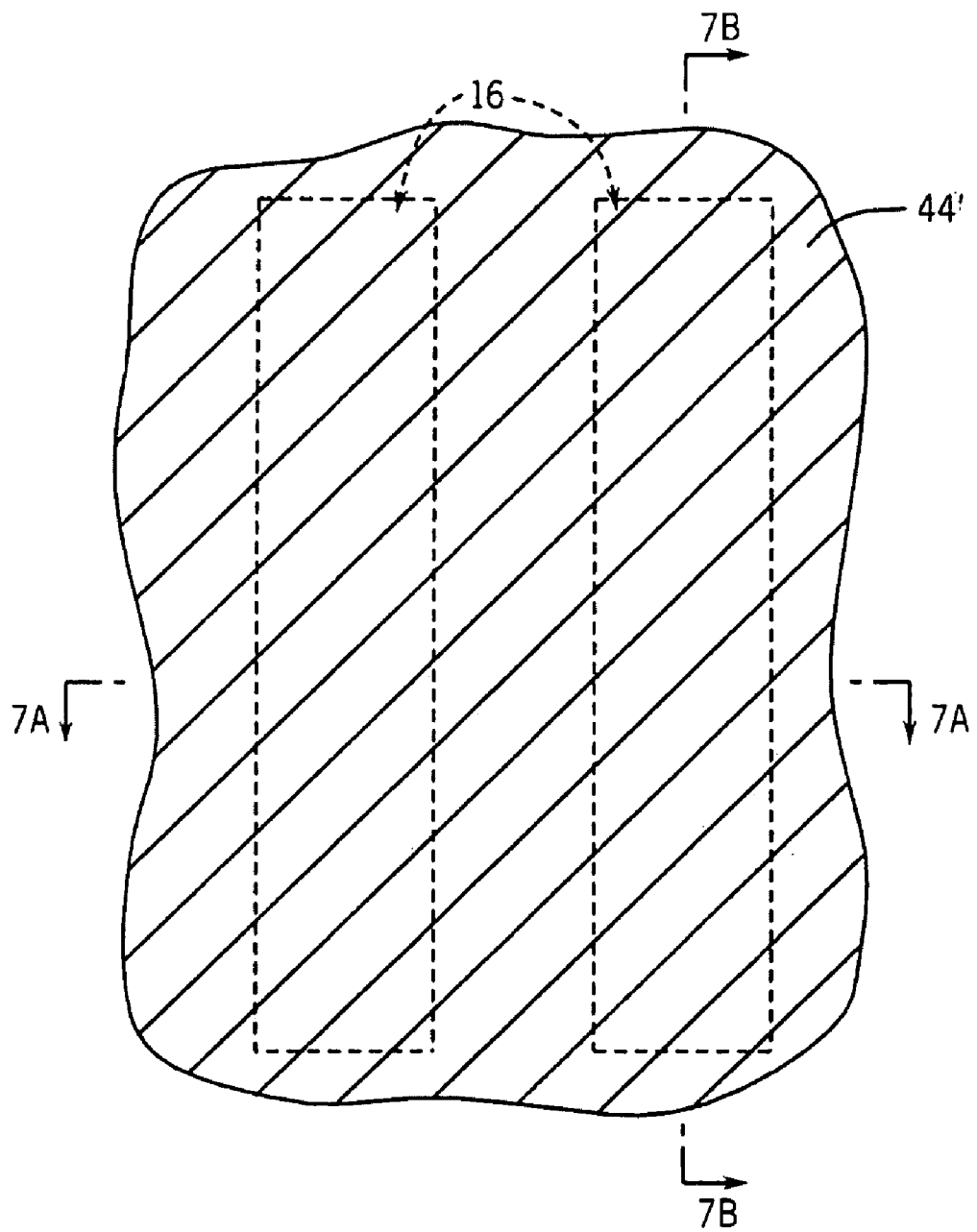
Figure 7A:
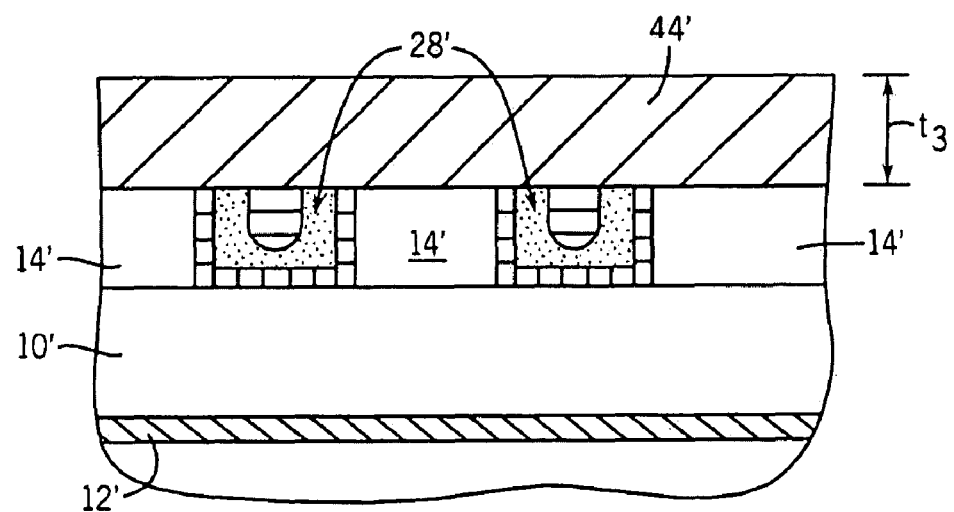
Figure 7B:
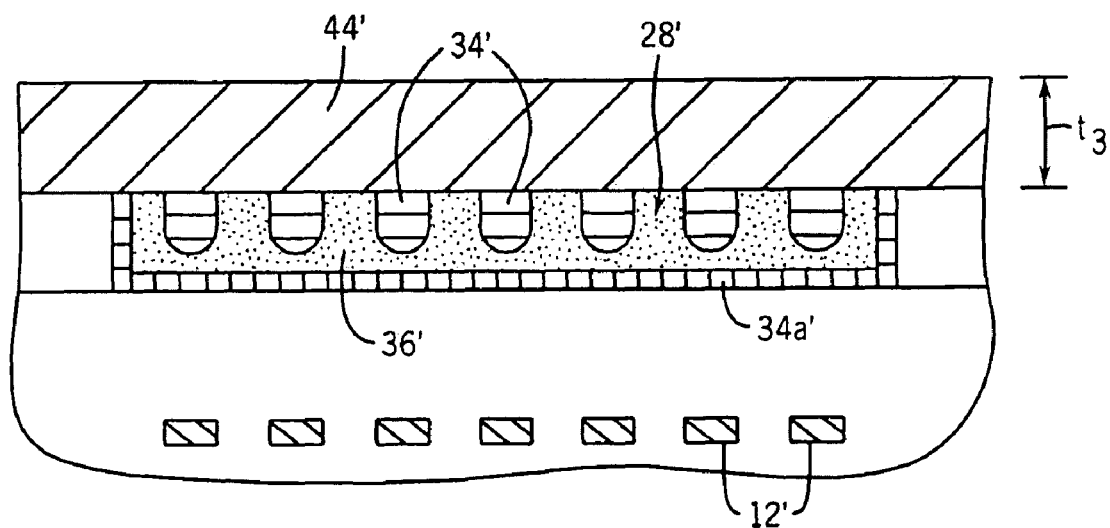

As depicted in FIGS. 7-7B, a cylindrical-phase block copolymer (BCP) material 44' having an inherent pitch at or about the L value of the block copolymer material 26' of the base layer 28' (or a ternary blend of block copolymer and homopolymers blended to have a pitch at or about the L value) is deposited (e.g., by spin casting) onto the annealed (and crosslinked) base layer 28' within the trenches 16'. The block copolymer material 44' can be deposited to a thickness ($t_3$) at or about its L value. The minority domain of the BCP material 44' is either identical to or preferentially wets the perpendicular cylinder (minority) domains 34' of the underlying base layer 28'.

Figure 8:
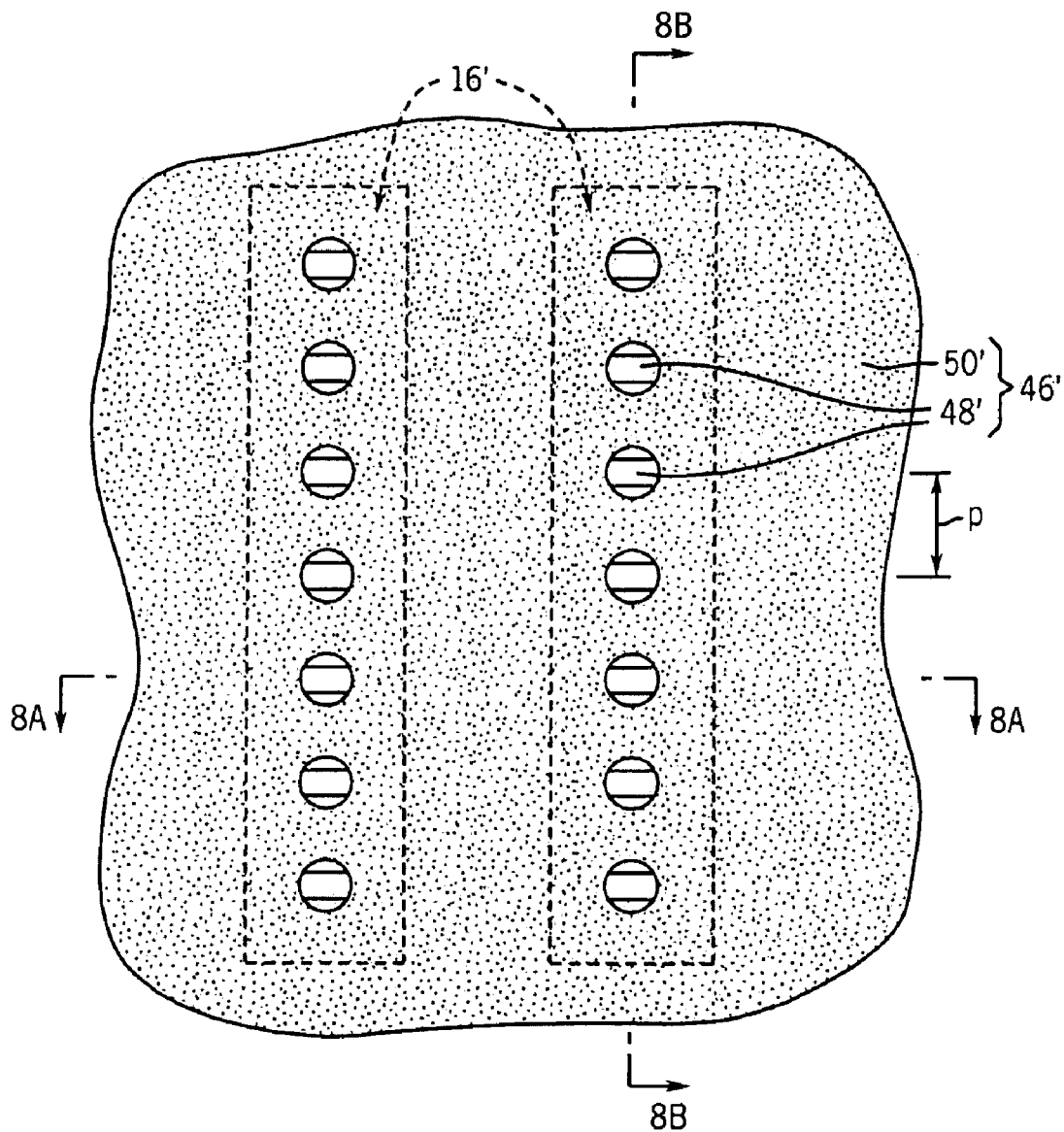
Figure 8A:
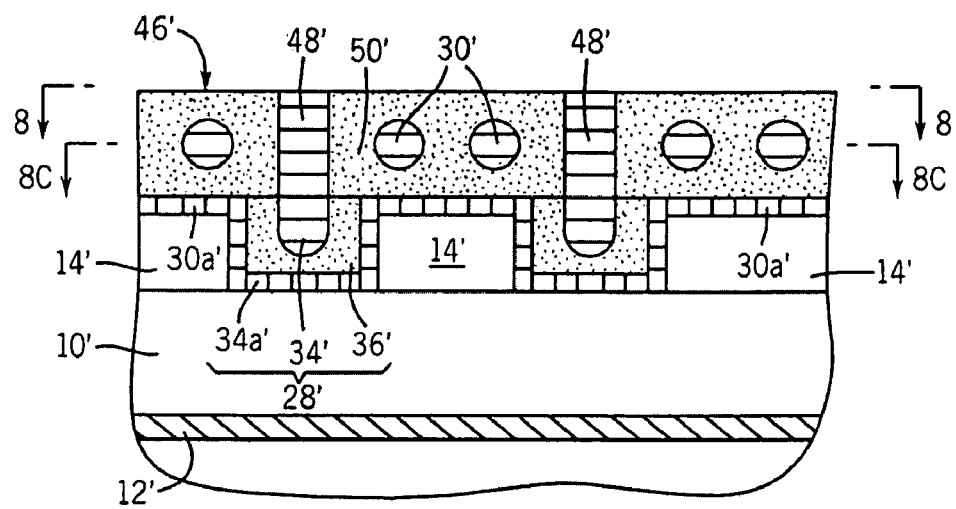
Figure 8B:
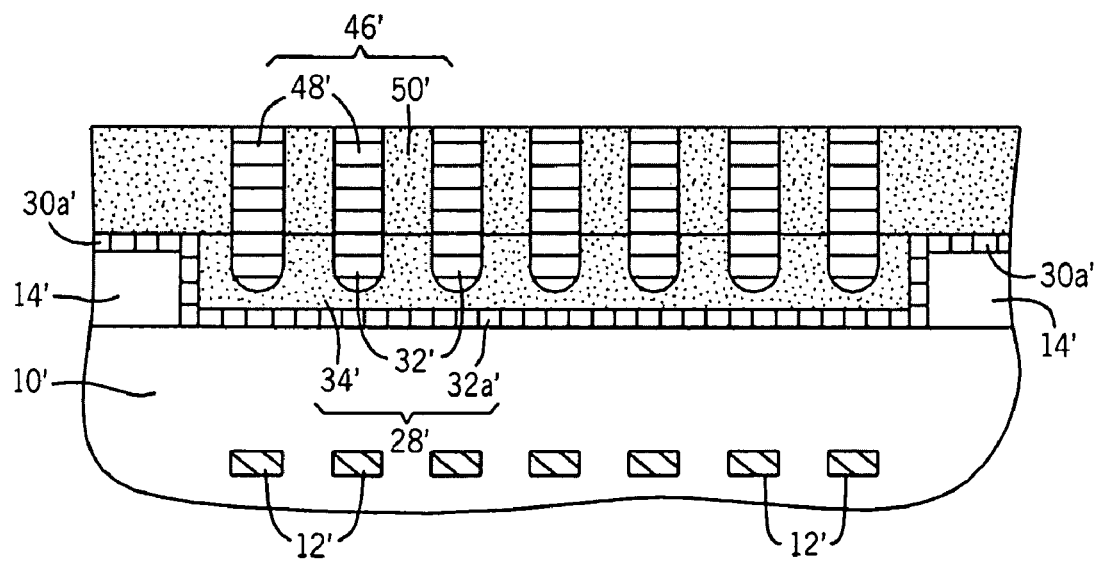
Figure 8C:
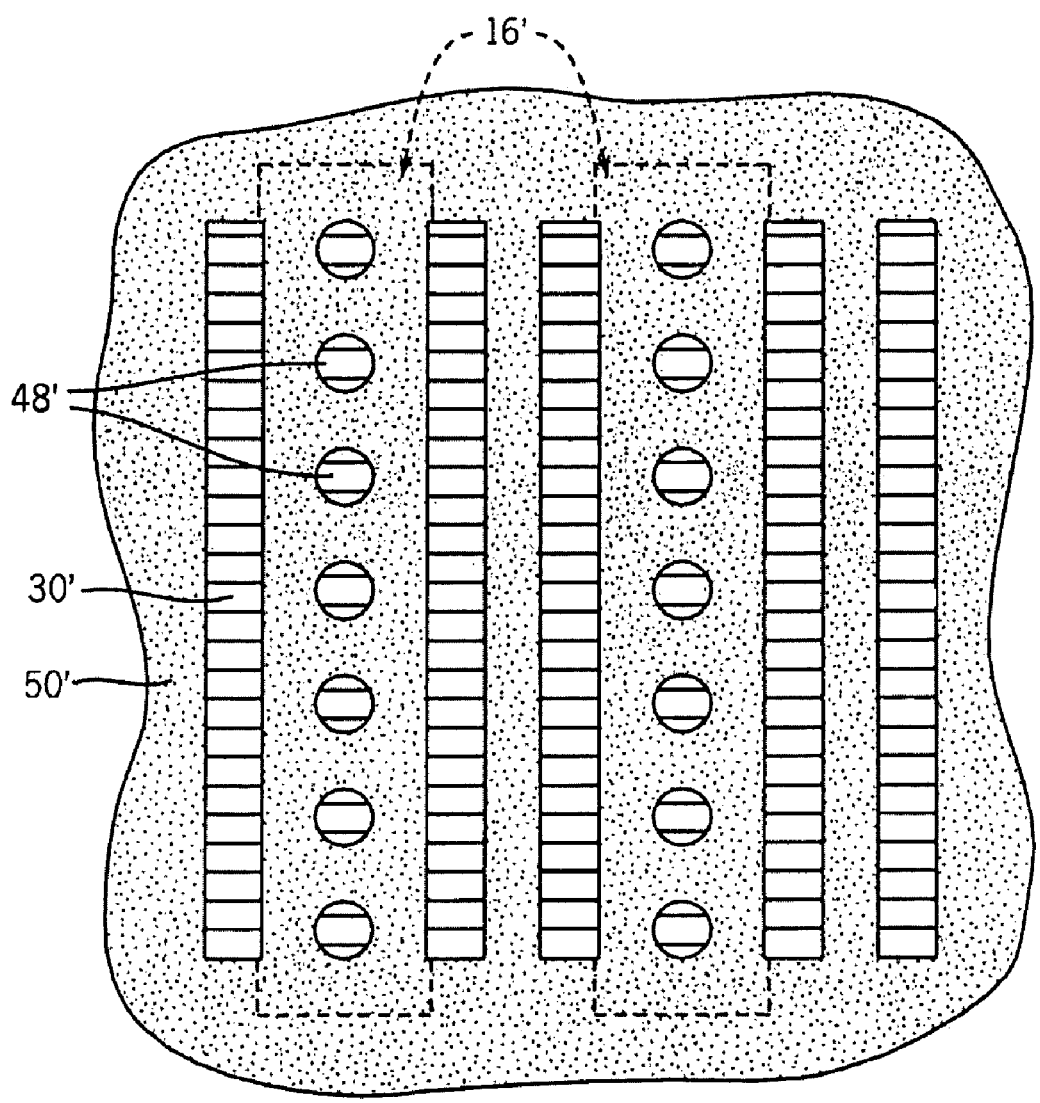
FIG. 8C is a top plan view of the substrate depicted in FIG. 8A taken along lines 8C-8C.

The block copolymer material 44' is then annealed to form a self-assembled material layer 46' over the base layer 28', as depicted in FIGS. 8A-8C. The polymer material 44' can be annealed, for example, by thermal annealing.

During the anneal, the chemical pattern of the perpendicular cylinder (minor) domains 34' of the base layer 28' templates and imposes an induced ordering effect on the self-assembling cylindrical-phase block copolymer material 44' to form a layer 46' of perpendicular-oriented cylinders 48' of the minority (preferred) block (e.g., PMMA) within a polymer matrix 50' of the majority block (e.g., PS), with the cylinders registered to the underlying pattern of perpendicular cylinders 34' of the base layer 28'. The diameter of the perpendicular cylinders 48' is at or about 0.5*L.

In addition, parallel cylinders 30' embedded in the matrix 50a' and a brush layer 30a' will form over the preferential wetting material layer 14', as shown in FIGS. 8A-8B.

Intrinsic periods of the two block copolymer materials 26', 44' can be matched, for example, through a ternary blend of either or both of the copolymer materials with one or more homopolymers to adjust the polymer periods (L values). See, for example, R. Ruiz, R. L. Sandstrom and C. T. Black, "Induced Orientational Order in Symmetric Diblock Copolymer Thin-Films," *Advanced Materials*, 2007, 19(4), 587-59. In embodiments of the method, the same cylindrical-phase block copolymer material is used for both block copolymer materials 26', 44'.

The annealed and self-assembled polymer layer 46' can then be treated to cross-link one of the polymer segments (e.g., the PS matrix 50'), as previously described.

After annealing and ordering of the cylindrical-phase BCP material 44' to form polymer material layer 46', one of the block components can be selectively removed to produce a porous film that can be used, for example, as a lithographic template or mask to pattern the underlying substrate 10' in a semiconductor processing to define a regular pattern of nanometer sized openings (i.e., about 10-100 nm).

Figure 9:
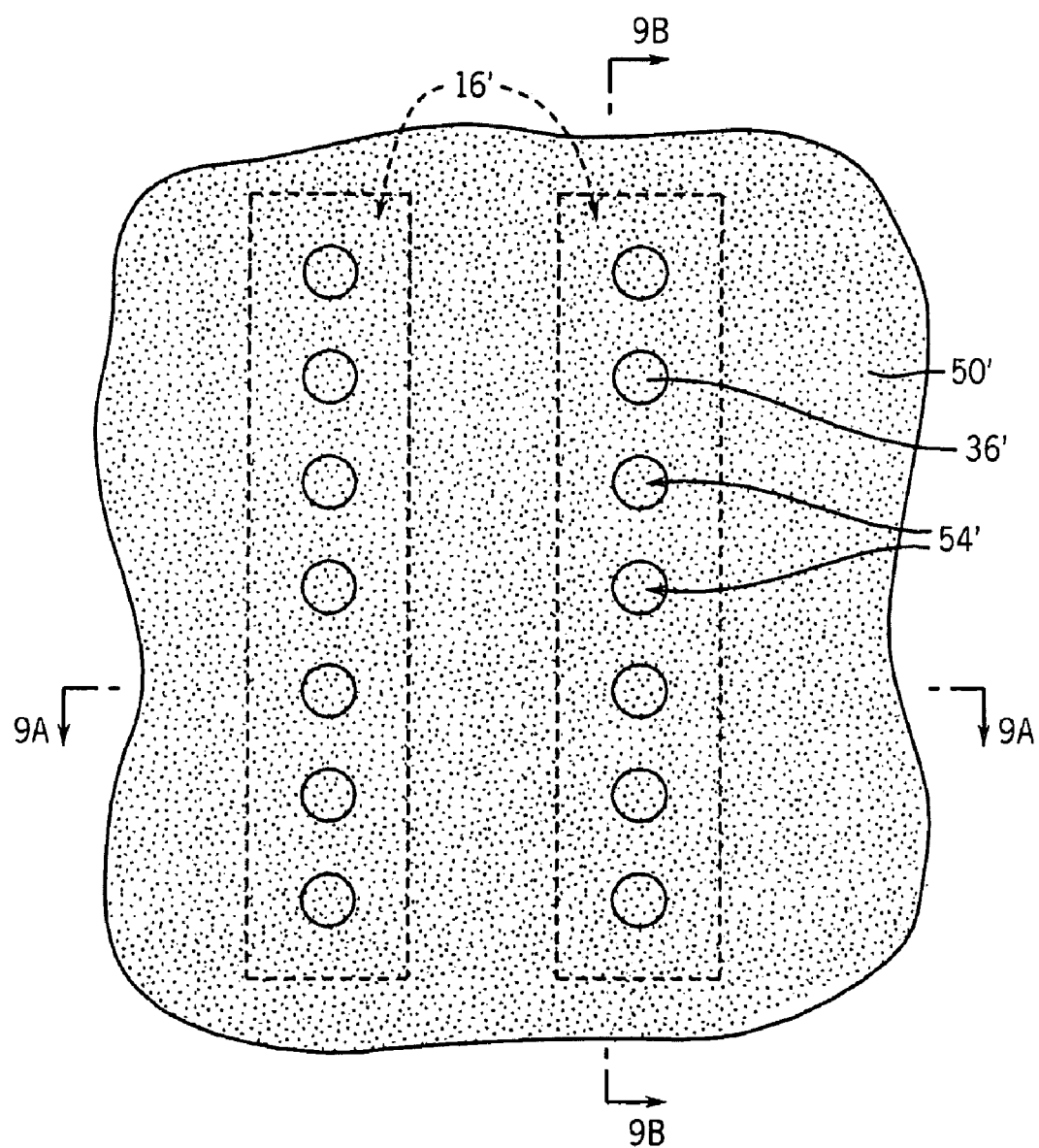
FIGS. 9-10 are top plan views of the substrate of FIG. 8 at subsequent stages, illustrating an embodiment of the removal of one of the polymer blocks to form a mask to etch the substrate.
Figure 9A:
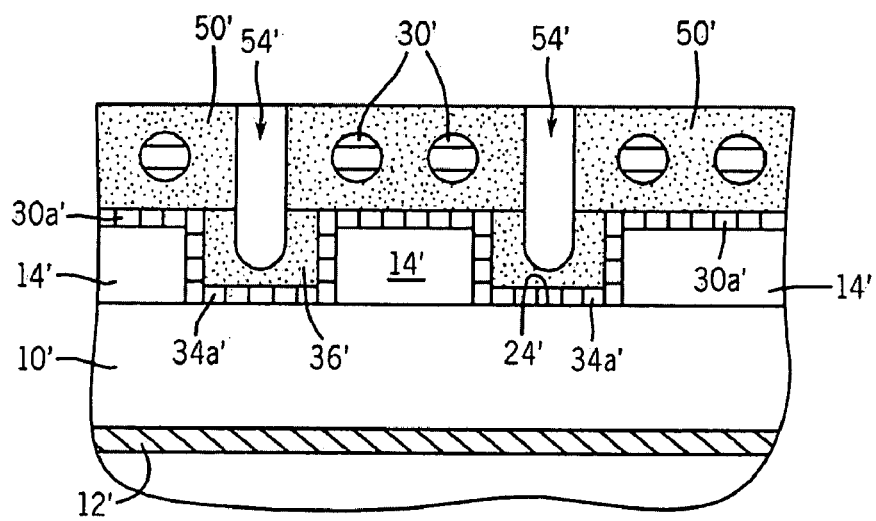
Figure 9B:
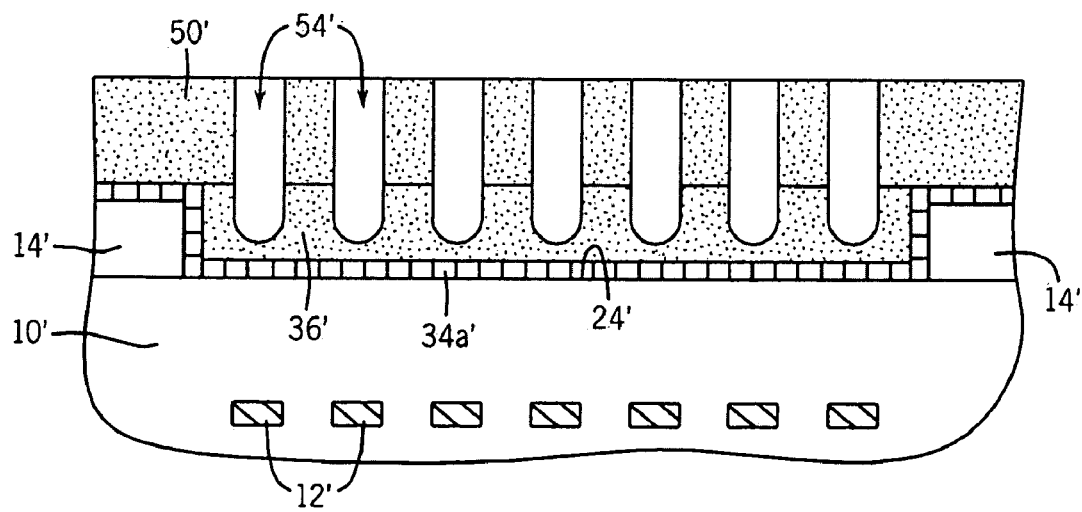

As illustrated in FIGS. 9-9B, in some embodiments, the cylindrical domains 48' and the underlying perpendicular cylinders 34' of the base layer 28' are selectively removed to form a porous film of regular cylindrical-shaped voids or openings 54' within a polymer matrix 36', 50' that are registered to the trench sidewalls 20'. For example, selective removal of PMMA domains 34', 48' from a cross-linked PS matrix 36', 50' can be performed, for example, by application of an oxygen ($O_2$) plasma, or by a chemical dissolution process such as acetic acid sonication by first irradiating the sample (ultraviolet (UV) radiation, 1 J/cm^2 254 nm light), then ultrasonicating the film in glacial acetic acid, ultrasonicating in deionized water, and rinsing the film in deionized water to remove the degraded PMMA.

Figure 10:
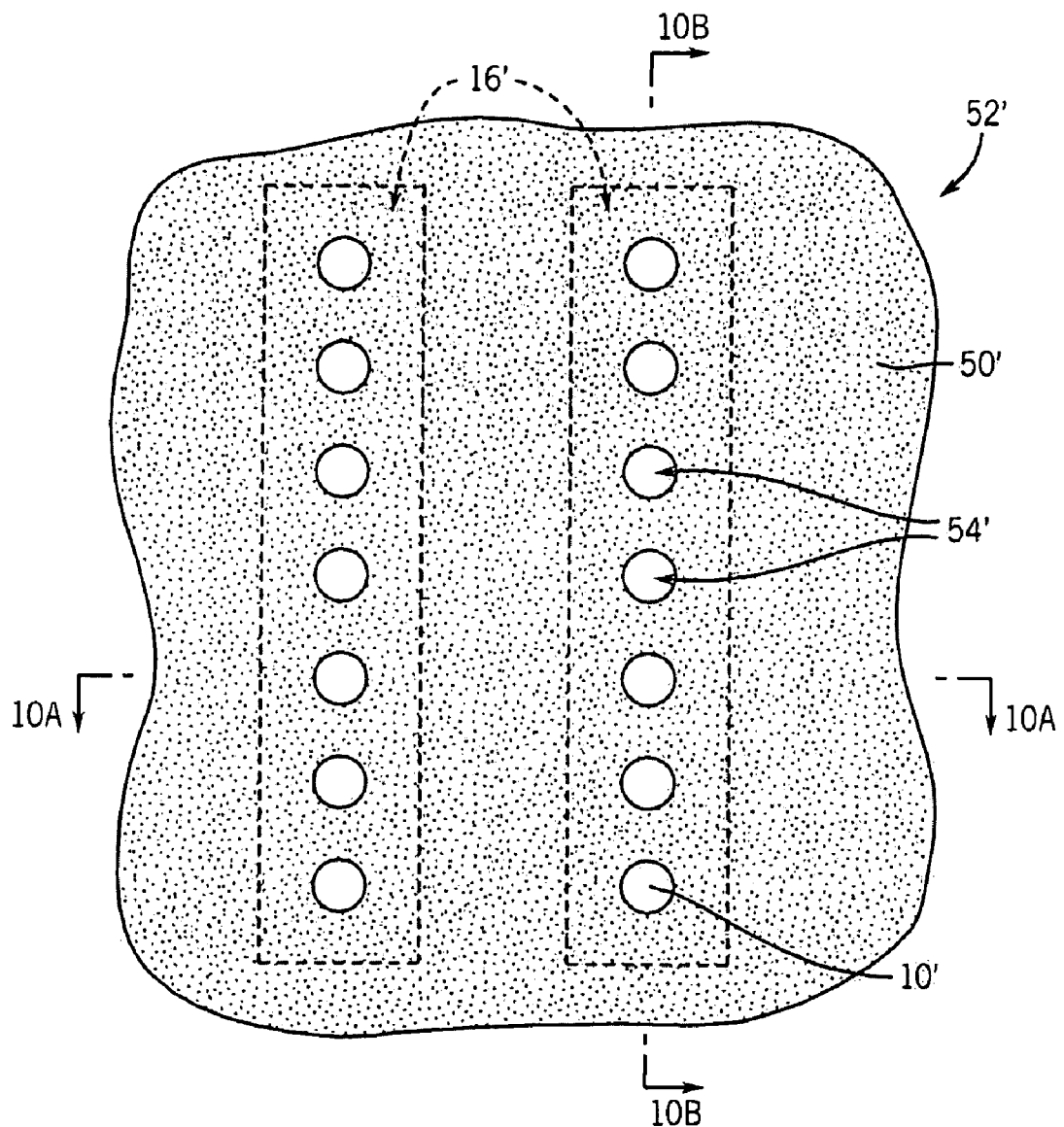
Figure 10A:
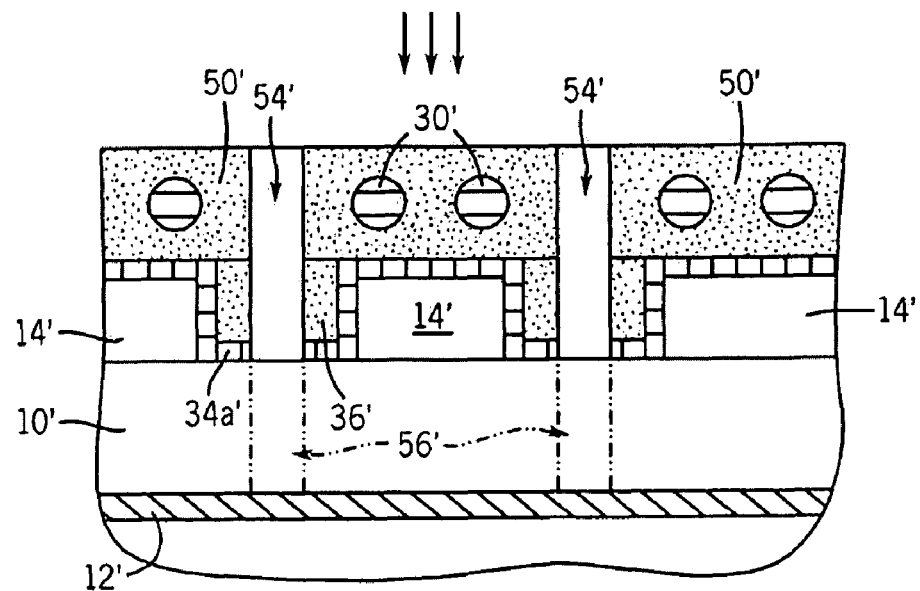
Figure 10B:
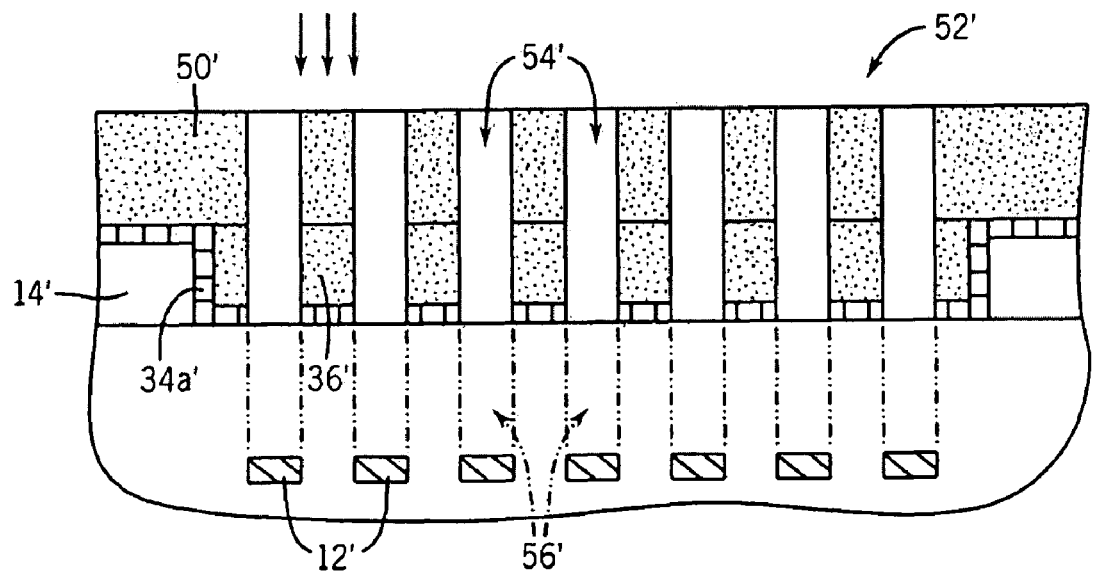

As shown, a portion of the PS matrix 36' situated underneath the openings 54' and over the trench floor 24' remains after the removal of the PMMA domains 34', 48'. The underlying PS matrix 36' can be removed, for example, by a reactive ion etch (RIE) using an oxygen plasma, for example, to expose the underlying substrate 10' at the trench floor 24', as illustrated in FIGS. 10-10B. The resulting polymer film 52' is composed of cylindrical openings 54' within the polymer matrix 36', 50' (e.g., of PS). The RIE etch may thin the polymer matrix 50', as shown, although not to a significant extent.

An embodiment of the application of the polymer film 52' is as an etch mask to form openings in the substrate 10'. For example, as illustrated in FIGS. 10-10B, the polymer film 52' can then be used as a mask to etch (arrows ↓) a series of cylindrical openings or contact holes 56' (shown in phantom) to the conductive lines 12' or other active area (e.g., semiconducting region, etc.) in the underlying substrate 10' (or an underlayer), for example, using a selective RIE plasma etch process.

Figure 11:
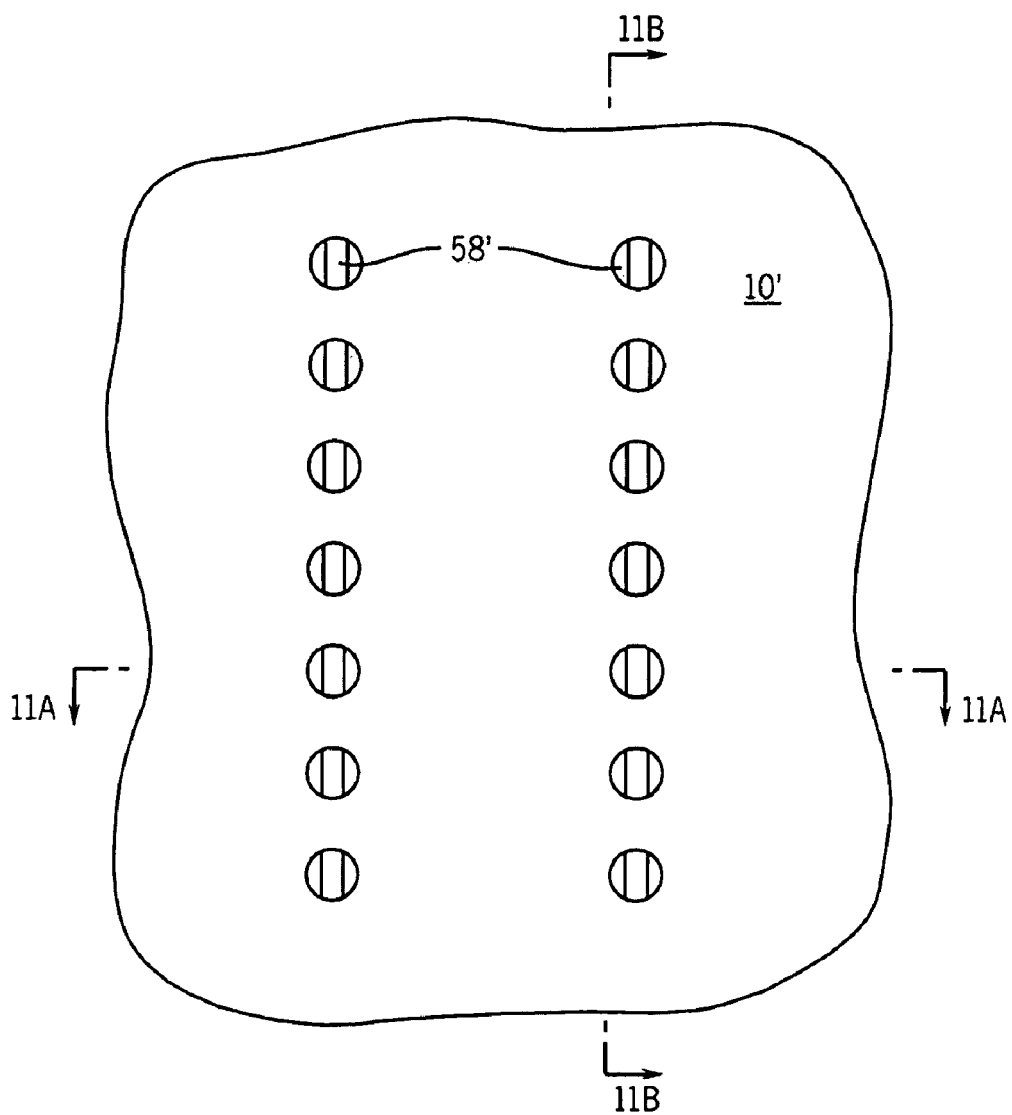
FIG. 11 is a top plan view of the substrate of FIG. 10 at a subsequent stage, illustrating filling of the etched openings in the substrate.
Figure 11A:
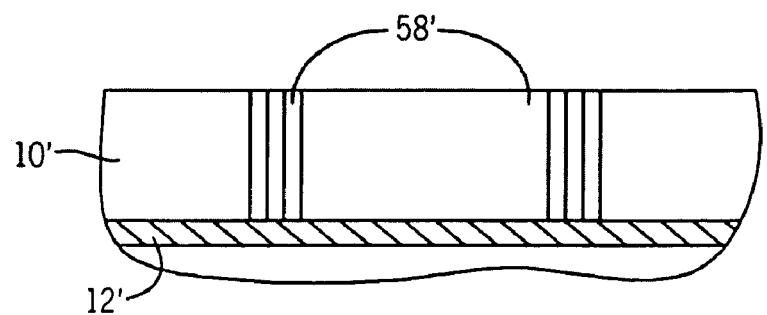
FIGS. 11A-11B illustrate elevational, cross-sectional views of a portion of the substrate depicted in FIG. 11 taken along lines 11A-11A and 11B-11B, respectively.
Figure 11B:
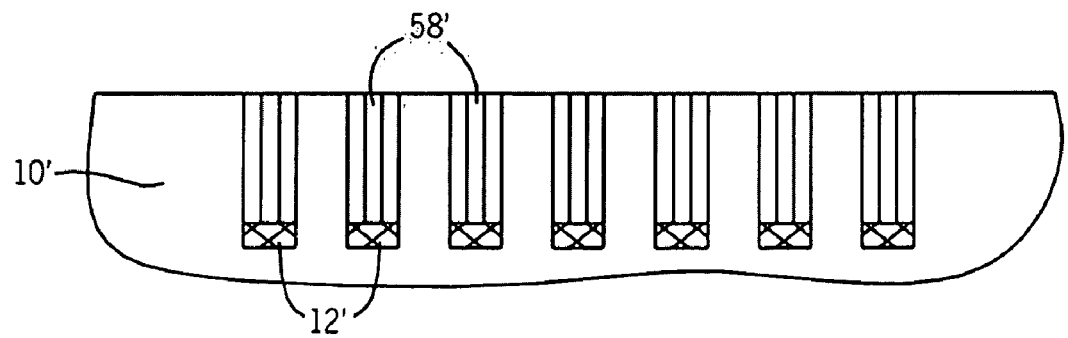

Further processing can then be performed as desired. For example, as depicted in FIGS. 11-11B, the residual polymer material 52' (e.g., 50', 34a', 36') can be removed and the substrate openings 56' can be filled with a material 58' such as a metal or metal alloy such as Cu, Al, W, Si, and $Ti_3N_4$, among others, to form arrays of cylindrical contacts to the conductive lines 12'. The cylindrical openings 56' in the substrate can also be filled with a metal-insulator-metal stack to form capacitors with an insulating material such as $SiO_2$, $Al_2O_3$, $HfO_2$, $ZrO_2$, $SrTiO_3$, and the like.

Methods of the disclosure provide a means of generating self-assembled diblock copolymer films composed of perpendicular-oriented cylinders in a polymer matrix. The methods provide ordered and registered elements on a nanometer scale that can be prepared more inexpensively than by electron beam lithography, EUV photolithography or conventional photolithography. The feature sizes produced and accessible by this invention cannot be easily prepared by conventional photolithography. Since the domain sizes and periods (L) involved in this method are determined by the chain length of a block copolymer (MW), resolution can exceed other techniques such as conventional photolithography. Processing costs using the technique are significantly less than extreme ultraviolet (EUV) photolithography, which has comparable resolution. The described methods and systems can be readily employed and incorporated into existing semiconductor manufacturing process flows and provide a low cost, high-throughput technique for fabricating small structures.

Embodiments of the invention eliminate the need for preparing trench floors that wet both blocks of a block copolymer to form perpendicular-oriented cylinders from block copolymer materials. While forming a neutral wetting trench floor can be accomplished, for example, by forming a neutral wetting material (e.g., random copolymer material) on the trench floor, it requires either processes that are not conventional to semiconductor manufacturing and/or extra processing steps. The present methods do not require unconventional processes for manufacturing the required structures.

In addition, embodiments of the disclosure providing chemical pattern templating of the upper layer provide fast processing of BCP materials relative to other methods of registering block copolymers such as processes that utilize graphoepitaxy with selective/neutral wetting trench or groove surfaces alone. The present methods provide formation of nanostructures in a manner that is more readily manufacturable.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of forming a nanostructured polymer material on a substrate, comprising:
    depositing a block copolymer material within a trench in a material layer on the substrate to a thickness of about 5-30% less than a thickness of the block copolymer material to form surface parallel-oriented cylinders upon annealing, the trench having a length, and a floor, opposing sidewalls and ends that are preferentially wetting to a minority block of the block copolymer, and the block copolymer material having an inherent pitch value (L); and
    annealing the block copolymer material such that said block copolymer material self-assembles into a plurality of perpendicular-oriented cylindrical domains of the minority block within a matrix of a second block of the block copolymer, the cylindrical domains being aligned with the sidewalls in a single row for the length of the trench, and
    said cylindrical domains having a face exposed at an air interface with the self-assembled block copolymer material and an opposing end embedded within and surrounded by said matrix of the second block.

2. The method of claim 1, wherein the thickness of the block copolymer material after annealing is about 5-30% less than the annealed thickness of the block copolymer material to form surface parallel-oriented cylinders.

3. The method of claim 1, wherein the thickness of the block copolymer material after annealing is about 10-20% less than the annealed thickness of the block copolymer material to form surface parallel-oriented cylinders.

4. The method of claim 1, wherein the air interface is preferential wetting to the majority block, and the block copolymer material is formed to a thickness of about 5-30% less than 1.5*L value of the block copolymer material.

5. The method of claim 4, wherein the thickness of the block copolymer material is about 10-20% less than 1.5*L value of the block copolymer material.

6. The method of claim 4, wherein the block copolymer material comprises poly(styrene)-b-poly(vinylpyridine).

7. The method of claim 1, wherein annealing the block copolymer material forms a brush layer on the trench floor comprising a bilayer of the majority block domains and the minority block domains with the minority block domains wetting the trench floor, and a total thickness of the block copolymer material after annealing is about 5-30% less than a combined thickness of the brush layer on the trench floor and the L value of the block copolymer material.

8. The method of claim 1, wherein the air interface is neutral wetting to the minority block and the majority block of the block copolymer material, and the thickness of the block copolymer material is about 5-30% less than the L value of the block copolymer material.

9. The method of claim 8, wherein the block copolymer material comprises poly(styrene)-b-poly(methylmethacrylate).

10. The method of claim 1, wherein the air interface is preferential wetting to the minority block of the block copolymer material, and the thickness of the block copolymer material after annealing is about 5-30% less than 2*L value of the block copolymer material.

11. The method of claim 10, wherein the block copolymer material comprises poly(styrene)-b-poly(dimethylsiloxane).

12. The method of claim 1, wherein the trench has a width of about 1-1.5×L.

13. A method of forming a nanostructured polymer material on a substrate, comprising:
    depositing a block copolymer material within a trench in a material layer on the substrate, the trench having a length, and a floor, opposing sidewalls and ends that are preferentially wetting to a minority block of the block copolymer, and the block copolymer material having an inherent pitch value (L) and a total initial thickness of about 5-30% less than a total initial thickness of the block copolymer material to form surface parallel cylinders upon annealing; and
    annealing the block copolymer material such that said block copolymer material self-assembles into a plurality of perpendicular-oriented cylindrical domains of the minority block within a matrix of a majority block of the block copolymer such that the cylindrical domains are aligned with the sidewalls in a single row for the length of the trench, said cylindrical domains having a face exposed at an air interface with the self-assembled block copolymer material and an opposing end embedded in and surrounded by the polymer matrix.

14. A method of forming a nanostructured polymer material on a substrate, comprising:
    annealing a block copolymer material situated in a trench in a material layer overlying the substrate, the trench having a length, and a floor, opposing sidewalls and ends that are preferentially wetting to a minority block of the block copolymer, and
    the block copolymer material having an inherent pitch value (L) and an initial total thickness within the trench of about 5-30% less than a total initial thickness of the block copolymer material to form surface parallel cylinders upon annealing;
    wherein the block copolymer material forms a plurality of cylindrical domains of the minority block of the block copolymer oriented perpendicular to the trench floor within a matrix of a majority block of the block copolymer and a layer of the minority polymer block wetting the trench floor, ends and sidewalls, the cylindrical domains being aligned with the sidewalls in a single row for the length of the trench, and the cylindrical domains comprising a face exposed at an air interface with the annealed block copolymer material and an opposing end embedded within and surrounded by said matrix.

15. A method of forming a nanostructured polymer material on a substrate, comprising:
    depositing a block copolymer material within a trench in a material layer on the substrate, the trench having a length, and a floor, opposing sidewalls and ends that are preferentially wetting to a minority block of the block copolymer, and the block copolymer material having an inherent pitch value (L); wherein said forming comprises flowing said block copolymer material on the material layer outside the trench into the trench wherein the block copolymer material within the trench has a total initial thickness of about 5-30% less than a total initial thickness of the block copolymer material to form surface parallel-oriented cylinders upon annealing; and annealing the block copolymer material wherein said block copolymer material self-assembles into a plurality of perpendicular-oriented cylindrical domains of the minority block within a matrix of a majority block, the cylindrical domains being aligned with the sidewalls in a single row for the length of the trench, and said cylindrical domains having a face exposed at an air interface with the annealed block copolymer material and an opposing end embedded within and surrounded by said matrix.

16. A method of forming a nanostructured polymer material on a substrate, comprising:

depositing a first cylindrical-phase block copolymer material having an inherent pitch value (L) within a trench in a material layer on the substrate to form a base layer, the trench having a length, floor, opposing sidewalls and ends that are preferentially wetting to a minority block of the block copolymer;

annealing the block copolymer material of the base layer such that said block copolymer material phase separates into perpendicular cylindrical domains of the minority block within a matrix of a majority block of the block copolymer such that the cylindrical domains are aligned with the sidewalls in a single row for the length of the trench, wherein said cylindrical domains have a face exposed at an air interface with the base layer and an opposing end surrounded by said matrix;

depositing a second cylindrical-phase block copolymer material onto the base layer to form an overlayer, wherein the second cylindrical-phase block copolymer material comprises a minority block that preferentially wets the cylindrical domains of the base layer and has an inherent pitch value (L) at or about the L value of the first block copolymer material; and annealing such that said second block copolymer material phase separates into cylindrical domains of a minority block within a matrix of a majority block, the cylindrical domains oriented perpendicular and aligned with and registered to the cylindrical domains of the base layer.

17. The method of claim 16, wherein the base layer material within the trench has a total thickness after annealing less than a thickness of the block copolymer material to form surface parallel cylinders.

18. The method of claim 17, wherein the base layer material within the trench has a total thickness after annealing of about 5-30% less than said thickness of the block copolymer material to form surface parallel cylinders.

19. The method of claim 16, wherein the polymer overlayer has a total thickness at or above its L value.

20. The method of claim 16, further comprising, after annealing the second block copolymer material, selectively removing the minority polymer blocks to form cylindrical openings extending through the overlayer and at least partially into the base layer.

21. The method of claim 20, further comprising exposing the substrate through said cylindrical openings and etching openings in the substrate.

22. A method of etching a substrate, comprising:

annealing a first block copolymer material situated in a trench in a material layer overlying the substrate to form a base layer, the trench having a length, floor, opposing sidewalls and ends that are preferentially wetting to a minority block of the first block copolymer, and the first block copolymer material having an inherent pitch value (L), wherein the first block copolymer material forms perpendicular-oriented cylindrical domains of the minority polymer block within a matrix of a majority polymer block, the cylindrical domains being aligned with the sidewalls in a single row for the length of the trench, and said cylindrical domains having a face exposed at an air interface with the annealed base layer and opposing ends within said matrix;

depositing a second cylindrical-phase block copolymer material onto the base layer to form an overlayer; and annealing the overlayer such that said second block copolymer material phase separates into cylindrical domains of a minority polymer block within a matrix of a majority polymer block, the cylindrical domains oriented perpendicular and aligned with and registered to the cylindrical domains of the base layer;

selectively removing one of the polymer blocks to form openings extending through the overlayer and at least partially into the base layer;

removing the remaining base layer within said openings to expose the substrate; and etching exposed portions of the substrate to form openings therein.

23. The method of claim 22, further comprising, after annealing the first block copolymer material, selectively crosslinking the polymer matrix of the base layer.

24. The method of claim 22, further comprising, after annealing the second block copolymer material, selectively crosslinking the polymer matrix of the overlayer.

25. The method of claim 22, wherein removing the base layer within the openings to expose the substrate comprises a reactive ion etch.

26. The method of claim 22, further comprising filling the openings in the substrate with a fill material.

27. The method of claim 26, wherein the fill material comprises a metal, a metal alloy, or a metal/insulator/metal stack.

28. A method of etching a substrate, comprising:

depositing a first block copolymer material within a trench in a material layer overlying the substrate to form a base layer, the trench having a length and a floor, opposing sidewalls and ends that are preferentially wetting to a minority block of the first block copolymer material, and the first block copolymer material having an inherent pitch value (L);

causing a microphase separation in the first block copolymer material of the base layer to form perpendicular-oriented cylindrical domains of the minority polymer block exposed at an air interface within a matrix of a majority polymer block, the perpendicular domains registered to the sidewalls in a single array extending the length of the trench;

selectively crosslinking the polymer matrix of the base layer;

depositing a second block copolymer material onto the base layer to form an overlayer;

causing a microphase separation in the second block copolymer material of the overlayer to form cylindrical domains of a minority polymer block within a matrix of a majority polymer block, the cylindrical domains oriented perpendicular to the trench floor and registered to the perpendicular domains of the base layer;

selectively removing the cylindrical polymer domains to form openings through the overlayer and into the base layer; and etching exposed portions of the substrate to form openings therein.

29. The method of claim 28, wherein the second block copolymer material has an inherent pitch value (L) at or about the L value of the first block copolymer material and a total thickness at or above said L value.

30. The method of claim 28, further comprising selectively crosslinking the polymer matrix of the overlayer prior to selectively removing the cylindrical polymer domains.

31. The method of claim 1, wherein the annealed block copolymer material within the trench comprises a layer of the minority block wetting the trench floor, ends and sidewalls.

32. A method of forming a nanostructured polymer material on a substrate, comprising:
    depositing a block copolymer material within a trench in a material layer on the substrate, the trench having a length, and a floor, opposing sidewalls and ends that are preferentially wetting to a first block of the block copolymer, and the block copolymer material having an inherent pitch value (L); and
    annealing the block copolymer material to form a plurality of perpendicular-oriented cylinders of the first block within a matrix of a second block of the block copolymer and a brush layer of the first block wetting the floor, sidewalls and ends of the trench, said cylinders aligned with the sidewalls in a single row for the length of the trench, and said cylinders having a face exposed at an air interface and an opposing end embedded within and surrounded by said matrix of the second block.

33. The method of claim 31, wherein the block copolymer material is deposited to a thickness within the trench of about 5-30% less than 1.5-2*L.

34. The method of claim 31, wherein the block copolymer material is deposited to a thickness within the trench of about 5-30% less than L.

35. The method of claim 31, wherein the block copolymer material is deposited to a thickness such that at the end of annealing, the thickness is about 5-30% less than 2*L.

* * * * *